(12) United States Patent
Kano et al.

(10) Patent No.: US 8,334,577 B2
(45) Date of Patent: Dec. 18, 2012

(54) SEMICONDUCTOR DEVICE

(75) Inventors: Takashi Kano, Hirakata (JP); Masayuki Hata, Kadoma (JP); Yasuhiko Nomura, Osaka (JP)

(73) Assignee: Future Light, LLC, Mountainview, CA (US)

( * ) Notice: Subject to any disclaimer, the term of this patent is extended or adjusted under 35 U.S.C. 154(b) by 794 days.

(21) Appl. No.: 12/402,196

(22) Filed: Mar. 11, 2009

(65) Prior Publication Data

US 2009/0174035 A1 Jul. 9, 2009

Related U.S. Application Data

(62) Division of application No. 11/518,235, filed on Sep. 11, 2006, now Pat. No. 7,518,204.

(30) Foreign Application Priority Data

Sep. 12, 2005 (JP) ................................ 2005-263264

(51) Int. Cl.
  *H01L 21/00* (2006.01)
(52) U.S. Cl. ............................ 257/431; 257/615; 257/97
(58) Field of Classification Search .................. 257/431, 257/615, 97
  See application file for complete search history.

(56) References Cited

U.S. PATENT DOCUMENTS

| | | | | |
|---|---|---|---|---|
| 6,150,674 A * | 11/2000 | Yuri et al. | ...................... | 257/103 |
| 6,232,623 B1 | 5/2001 | Morita | | |
| 6,339,014 B1 * | 1/2002 | Ishida et al. | .................. | 438/503 |
| 6,388,275 B1 | 5/2002 | Kano | | |
| 6,456,638 B1 * | 9/2002 | Fukunaga | .................. | 372/45.01 |
| 6,515,313 B1 | 2/2003 | Ibbetson et al. | | |
| 6,518,602 B1 * | 2/2003 | Yuasa et al. | .................... | 257/102 |
| 6,552,376 B1 | 4/2003 | Koike et al. | | |
| 6,566,677 B2 * | 5/2003 | Kano et al. | ........................ | 257/15 |
| 6,589,857 B2 * | 7/2003 | Ogawa et al. | .................. | 438/502 |
| 6,608,330 B1 | 8/2003 | Yamada | | |
| 6,611,004 B2 * | 8/2003 | Morimoto | ........................ | 257/99 |
| 6,639,258 B2 | 10/2003 | Koike et al. | | |
| 6,642,546 B2 * | 11/2003 | Kuramoto et al. | ............... | 257/94 |
| 6,791,120 B2 * | 9/2004 | Toda et al. | ..................... | 257/103 |
| 6,806,109 B2 * | 10/2004 | Furuya et al. | .................... | 438/22 |

(Continued)

FOREIGN PATENT DOCUMENTS

JP 2000140052 5/2000

(Continued)

OTHER PUBLICATIONS

Notification of Reasons for Refusal from corresponding Japanese Application 2005-263264, dated Jun. 1, 2010; English translation included.

*Primary Examiner* — Laura Menz
(74) *Attorney, Agent, or Firm* — Ditthavong Mori & Steiner, P.C.

(57) ABSTRACT

A semiconductor device includes a semiconductor substrate formed of at least two kinds of group III elements and nitrogen, an active layer formed on the semiconductor substrate, and a nitride semiconductor layer formed on a surface of the semiconductor substrate and formed between the semiconductor substrate and the active layer. The nitride semiconductor layer is formed of the same constituent elements of the semiconductor substrate. A composition ratio of the lightest element among the group III elements of the nitride semiconductor layer is higher than a composition ratio of the corresponding element of the semiconductor substrate.

7 Claims, 14 Drawing Sheets

U.S. PATENT DOCUMENTS

| | | | |
|---|---|---|---|
| 6,872,967 B2 * | 3/2005 | Kano et al. | 257/15 |
| 6,954,478 B2 * | 10/2005 | Nomura et al. | 372/46.01 |
| 6,977,952 B2 * | 12/2005 | Yamaguchi et al. | 372/45.01 |
| 7,030,428 B2 | 4/2006 | Saxler | |
| 7,033,854 B2 | 4/2006 | Morita | |
| 7,042,017 B2 | 5/2006 | Yamada | |
| 7,119,378 B2 | 10/2006 | Kozaki | |
| 7,125,736 B2 | 10/2006 | Morita | |
| 7,177,336 B2 | 2/2007 | Taneya et al. | |
| 7,279,717 B2 | 10/2007 | Yamada | |
| 7,282,745 B2 * | 10/2007 | Yamaguchi et al. | 257/94 |
| 7,421,000 B2 | 9/2008 | Taneya et al. | |
| 7,453,102 B2 * | 11/2008 | Nomura et al. | 257/103 |
| 7,518,204 B2 * | 4/2009 | Kano et al. | 257/431 |
| 7,745,841 B2 * | 6/2010 | Kuramoto | 257/96 |
| 7,876,798 B2 * | 1/2011 | Kohda | 372/43.01 |
| 8,022,427 B2 * | 9/2011 | Miyake et al. | 257/98 |
| 8,058,660 B2 * | 11/2011 | Karino et al. | 257/94 |
| 2001/0010941 A1 | 8/2001 | Morita | |
| 2001/0030316 A1 * | 10/2001 | Kuramoto et al. | 257/12 |
| 2001/0035531 A1 * | 11/2001 | Kano et al. | 257/96 |
| 2003/0057434 A1 * | 3/2003 | Hata et al. | 257/103 |
| 2003/0151044 A1 | 8/2003 | Yamada | |
| 2003/0173560 A1 * | 9/2003 | Kano et al. | 257/15 |
| 2003/0209704 A1 | 11/2003 | Yamada | |
| 2004/0087051 A1 * | 5/2004 | Furuya et al. | 438/47 |
| 2005/0196888 A1 | 9/2005 | Morita | |
| 2005/0226295 A1 | 10/2005 | Taneya et al. | |
| 2006/0011946 A1 * | 1/2006 | Toda et al. | 257/202 |
| 2006/0017073 A1 * | 1/2006 | Hata et al. | 257/222 |
| 2006/0098703 A1 | 5/2006 | Kuramoto | |
| 2006/0237733 A1 | 10/2006 | Yamada | |
| 2007/0057337 A1 * | 3/2007 | Kano et al. | 257/431 |
| 2007/0153854 A1 | 7/2007 | Taneya et al. | |
| 2007/0262293 A1 | 11/2007 | Fujikura | |
| 2008/0210949 A1 | 9/2008 | Makabe et al. | |
| 2008/0237569 A1 * | 10/2008 | Nago et al. | 257/13 |
| 2009/0072253 A1 * | 3/2009 | Karino et al. | 257/94 |
| 2009/0174035 A1 * | 7/2009 | Kano et al. | 257/615 |
| 2009/0215248 A1 | 8/2009 | Nakahata et al. | 438/481 |
| 2009/0267100 A1 | 10/2009 | Miyake et al. | 257/98 |
| 2010/0019255 A1 * | 1/2010 | Karino et al. | 257/94 |
| 2011/0095331 A1 * | 4/2011 | Hanawa et al. | 257/99 |
| 2011/0114916 A1 * | 5/2011 | Yoshizumi et al. | 257/13 |
| 2011/0220871 A1 * | 9/2011 | Kamikawa et al. | 257/13 |
| 2012/0009711 A1 * | 1/2012 | Karino et al. | 438/47 |

FOREIGN PATENT DOCUMENTS

| | | |
|---|---|---|
| JP | 2000101140 | 7/2000 |
| JP | 2000200947 | 7/2000 |
| JP | 2000349396 | 12/2000 |
| JP | 2001077423 | 3/2001 |
| JP | 2003031552 | 1/2003 |
| JP | 2004247563 | 9/2004 |
| JP | 2005217375 | 8/2005 |

* cited by examiner

SEMICONDUCTOR DEVICE

CROSS REFERENCE TO RELATED APPLICATIONS

This application is a divisional application under 35 U.S.C. §120 of co-pending application Ser. No. 11/518,235 filed Sep. 11, 2006, which was based upon and claimed the benefit of priority from prior Japanese Patent Application No. 2005-263264, filed on Sep. 12, 2005; the entire contents of which are incorporated herein by reference.

BACKGROUND OF THE INVENTION

1. Field of the Invention

The present invention relates to a semiconductor device, and more particularly to a semiconductor device having a nitride semiconductor layer.

2. Description of the Related Art

In recent years, the use of nitride semiconductor devices as light sources for large capacity optical disc has been expected and the development has become active. Moreover, conventionally, there are known nitride semiconductor laser devices in which a nitride semiconductor layer is formed on a GaN substrate as a nitride semiconductor substrate (see, for example, Japanese Unexamined Application No. 2000-140052).

Japanese Unexamined Application No. 2000-140052 discloses a structure of a nitride semiconductor laser device formed by sequentially growing an n-type layer, an n-type cladding layer made of an AlGaN layer, a luminous layer including an InGaN active layer with a multiple quantum well (MQW) structure, and a p-type cladding layer made of an AlGaN layer on an n-type GaN substrate. In the nitride semiconductor laser device described in Japanese Unexamined Application No. 2000-140052, the InGaN active layer is sandwiched by AlGaN cladding layers that occupy most of the thickness of the light-emitting device structure formed on the GaN substrate.

However, the conventional nitride semiconductor laser device described in Japanese Unexamined Application No. 2000-140052 has the following drawback. In the process of forming a layered structure of the nitride semiconductor laser device on the GaN substrate by crystal growth, a warp and a crack are generated in the GaN substrate by a lattice constant difference between the GaN substrate and each of the AlGaN cladding layers that occupy most of the thickness of the light-emitting device structure. This disadvantageously causes a reduction in yield of the nitride semiconductor laser device.

Further, conventionally, a structure of a semiconductor light-emitting device is known which suppresses occurrence of a warp and occurrence of a crack in the substrate by using an AlGaN substrate having substantially the same Al composition ratio as that of an AlGaN cladding layer in order to reduce a lattice constant difference between the AlGaN cladding layer and the substrate. Unlike the one disclosed in Japanese Unexamined Application No. 2000-140052, the structure of this conventional semiconductor light-emitting device makes it possible to suppress a reduction in yield caused by the warp and the crack in the substrate.

In the aforementioned conventional semiconductor light-emitting device in which the Al composition ratio of the AlGaN cladding layer is substantially the same as that of the AlGaN substrate, it is possible to suppress the reduction in yield caused by the warp and the crack in the substrate. A decrease, however, in absorption power of Al, Ga, and N which are constituent elements of the nitride semiconductor layer growing on the AlGaN substrate leads to a drawback. This tends to create pit and dislocation in the light-emitting device grown on the AlGaN substrate, causing a problem of a deteriorated device characteristic of the semiconductor device.

Moreover, in the nitride semiconductor laser device described in Japanese Unexamined Application No. 2000-140052 has the following drawback. The InGaN active layer is sandwiched by AlGaN cladding layers that occupy most of the thickness of the light-emitting device structure formed on the substrate. As a result, strain occurs in the active layer due to the lattice constant difference between the AlGaN cladding layer and the InGaN substrate. This disadvantageously causes a reduction in luminous efficiency due to the strain in the active layer (luminous layer). As a result, this also causes a problem of a deteriorated device characteristic.

SUMMARY OF THE INVENTION

A first aspect of a semiconductor device includes a semiconductor substrate formed of at least two kinds of group III elements and nitrogen, an active layer formed on the semiconductor substrate, and a nitride semiconductor layer formed on a surface of the semiconductor substrate and formed between the semiconductor substrate and the active layer. The nitride semiconductor layer formed of the same constituent elements of the semiconductor substrate. A composition ratio of the lightest element among the group III elements of the nitride semiconductor is higher than a composition ratio of the corresponding element of the semiconductor substrate.

As mentioned above, according to the semiconductor device of the first aspect, the nitride semiconductor layer is formed on the surface of the semiconductor substrate formed of at least two kinds of group III elements and nitrogen. The nitride semiconductor layer is formed of the same constituent elements of the semiconductor substrate. The composition ratio of the lightest element among the group III elements of the constituent elements is higher than the composition ratio of the corresponding element of the semiconductor substrate. That is the composition ratio of the lightest element having a high bonding strength to nitrogen is increased. Accordingly, when the semiconductor device layer is grown on the nitride semiconductor layer, it is possible to easily bond the nitrogen, which is the constitute element of a semiconductor device layer, to the lightest element among the group III elements in the constituent elements of the nitride semiconductor layer. This makes it possible to suppress occurrence of pit in the semiconductor layer which forms the semiconductor device and formed on the nitride semiconductor layer. Therefore, it is possible to suppress deterioration in device characteristic of the semiconductor device. Furthermore, the composition ratio of the lightest element of the nitride semiconductor layer formed on the surface of the semiconductor substrate is higher than the semiconductor substrate. With this composition ratio, the nitride semiconductor layer gets harder than the semiconductor substrate. This makes it possible to bend dislocation which exists in the semiconductor substrate, at the boundary surface between the semiconductor substrate and the nitride semiconductor layer. Thereby, it is possible to suppress dislocation, which exists in the semiconductor substrate, propagated over the nitride semiconductor layer to the semiconductor device layer of higher layer. Also, the dislocation of the semiconductor device layer can be reduced as compared with the conventional case. This also makes it possible to suppress deterioration in device characteristic of the semiconductor device. Furthermore, the semiconductor substrate is formed of at least two kinds of group III elements and nitrogen, it is possible to reduce the lattice constant difference between the semiconductor substrate and the cladding layer, when the semiconductor substrate has the same constituent element of a cladding layer formed on the semiconductor substrate. Accordingly, it is possible to suppress occurrence of a warp and a crack in the semiconductor substrate, which derive from the lattice constant difference between the semiconductor substrate and the cladding layer.

The semiconductor device according to the first aspect preferably further includes a cladding layer formed of the same constituent elements of the semiconductor substrate. According to this structure, since the lattice constant difference between the cladding layer and the semiconductor substrate can be reduced, it is possible to easily suppress occurrence of the warp and the crack in the semiconductor substrate, which derive from the lattice constant difference between the cladding layer and the semiconductor substrate.

In the semiconductor device according to the first aspect, the semiconductor substrate and the nitride semiconductor layer are preferably AlGaN layers and the Al composition ratio of the nitride semiconductor layer is preferably higher than that of the semiconductor substrate. According to this structure, since Al has a higher adhesion strength to nitrogen than Ga, it is possible to easily adhere nitrogen, which is a constituent element of the semiconductor device layer, to Al of nitride semiconductor layer of lower layer when the semiconductor device layer is grown on the nitride semiconductor layer. This makes it possible to suppress the occurrence of the pit in the semiconductor device layer formed on the nitride semiconductor layer. Furthermore, according to this structure, since the AlGaN having a high Al composition ratio is harder than the AlGaN having a low Al composition ratio, it is possible to make the nitride semiconductor layer harder than the semiconductor substrate. Accordingly, dislocation which exists in the semiconductor substrate can be bent at the boundary surface between the semiconductor substrate and the nitride semiconductor layer. Therefore, it is possible to effectively suppress dislocation propagated to the semiconductor device layer formed on the nitride semiconductor layer.

In the semiconductor device according to the first aspect, the semiconductor substrate and the nitride semiconductor layer are preferably InGaN layers and the Ga composition ratio of the nitride semiconductor layer is preferably higher than the semiconductor substrate. According to this structure, since Ga has a higher adhesion strength to nitrogen than In, it is possible to easily adhere nitrogen, which is a constituent element of the semiconductor device layer, to Ga of the nitride semiconductor layer of lower layer when the semiconductor device layer is grown on the nitride semiconductor layer. This makes it possible to suppress the occurrence of the pit in the semiconductor device layer formed on the nitride semiconductor layer. Furthermore, according to this structure, since the InGaN having a high Ga composition ratio is harder than the InGaN having a low Ga composition ratio, it is possible to make the nitride semiconductor layer harder than the semiconductor substrate. Accordingly, dislocation, which exists in the semiconductor substrate, can be bent at the boundary surface between the semiconductor substrate and the nitride semiconductor layer. Therefore, it is possible to effectively suppress dislocation propagated to the semiconductor device layers formed on the nitride semiconductor layer.

In the semiconductor device according to the first aspect, the nitride semiconductor layer is preferably formed to contact with the surface of the semiconductor substrate. According to this structure, dislocation, which exists in the semiconductor substrate, can be bent by the nitride semiconductor layer formed immediately above the semiconductor substrate. As a result, it is possible to effectively suppress dislocation propagated to the semiconductor device layers formed on the nitride semiconductor layer.

In the semiconductor device according to the first aspect, the nitride semiconductor layer is preferably formed is an altered layer where the surface of the semiconductor substrate is altered. According to this structure, it is possible to form the nitride semiconductor layer which can suppress the occurrence of the pit and propagation of dislocation, without the crystal-growth of the nitride semiconductor layer on the semiconductor substrate.

A second aspect of a semiconductor device includes a semiconductor layer formed of at least two kinds of group III elements and nitrogen, an active layer, a substrate adhered on a surface of the active layer located opposite side of a surface facing the semiconductor layer, and a nitride semiconductor layer formed on a surface of the semiconductor layer and formed between the semiconductor layer and the active layer. The nitride semiconductor layer is formed of the same constituent elements of the semiconductor layer. A composition ratio of the lightest element among the group III elements of the nitride semiconductor layer is higher than the composition ratio of the corresponding element of the semiconductor layer.

As mentioned above, according to second aspect of the semiconductor device includes a cladding layer formed of at least two kinds of group III elements and nitrogen, an active layer and a nitride semiconductor layer formed on a surface of the cladding layer and formed between the cladding layer and the active layer. The nitride semiconductor layer is formed of the same constituent elements of the cladding layer. A composition ratio of the lightest element among the group III elements of the nitride semiconductor layer is higher than the composition ratio of the corresponding element of the cladding layer. Since this makes the nitride semiconductor layer harder than the cladding layer, it is possible to bend dislocation, which exists in the cladding layer, at the boundary surface between the cladding layer and the nitride semiconductor layer. Therefore, it is possible to suppress dislocation, which exists in the cladding layer, propagated over the nitride semiconductor layer to the active layer, and the dislocation of the active layer can be reduced as compared with the conventional case. This also makes it possible to suppress deterioration in device characteristic of the semiconductor device.

In the semiconductor device according to the second aspect, a compressive strain is preferably applied to the active layer in a direction along a main surface of the active layer. According to this structure, when the compressive strain is applied to the active layer, tensile strain, which is opposite to the compressive strain in a direction along the main surface of the active layer, can be caused in the nitride semiconductor layer. As a result, the stress generated in the nitride semiconductor layer can compensate for the stress generated in the active layer. Accordingly, this makes it possible to suppress generation of crystal defect in the active layer (luminous layer) of the semiconductor device. Thereby, it is possible to improve the characteristic (luminous efficiency) of the semiconductor device and lengthen a life of the semiconductor device.

In the semiconductor device according to the second aspect, a lattice constant of the active layer is preferably larger than a lattice constant of the semiconductor layer. According to this structure, since the lattice constant of the nitride semiconductor layer is smaller than the active layer, it is possible to generate tensile strain in the nitride semiconductor layer, and tensile strain is opposite to the compression strain in a direction along the main surface of the active layer, the compression strain derived from the lattice constant difference between the semiconductor layer and the active layer. As a result, stress generated in the nitride semiconductor layer can compensate for stress generated in the active layer. Accordingly, this makes it possible to suppress generation of crystal defect in the active layer (luminous layer) of the semiconductor device. Thereby, it is possible to improve the characteristic (luminous efficiency) of the semiconductor device and lengthen a life of the semiconductor device.

In the semiconductor device according to the second aspect, the cladding layer and the nitride semiconductor layer are preferably AlGaN layers and an Al composition ratio of the nitride semiconductor layer is higher than the cladding layer. According to this structure, since the AlGaN having a high Al composition ratio is harder than the AlGaN having a low Al composition ratio, it is possible to make the nitride semiconductor layer harder than the semiconductor layer. As a result, it is possible to bend dislocation, which exists in the semiconductor substrate, at the boundary surface between the semiconductor substrate and the nitride semiconductor layer. Furthermore, according to this structure, in a case where the lattice constant of the active layer is larger than the semiconductor layer, the lattice constant of the nitride semiconductor layer is smaller than the semiconductor layer. Accordingly, tensile strain, which is opposite to the compression strain in a direction along the main surface of the active layer, can be caused in the nitride semiconductor layer, derived from the lattice constant difference between the semiconductor layer and the active layer. As a result, stress generated in the nitride semiconductor layer can easily compensate for stress generated in the active layer.

In the semiconductor device according to the second aspect of the present invention, the semiconductor layer and the nitride semiconductor layer are preferably InGaN layers and the Ga composition ratio of the nitride semiconductor layer is higher than that of the semiconductor layer. According to this structure, since the InGaN having a high Ga composition ratio is harder than the InGaN having a low Ga composition ratio, it is possible to make the nitride semiconductor layer harder than the semiconductor layer. Therefore, dislocation which exists in the semiconductor substrate can be bent at the boundary surface between the semiconductor substrate and the nitride semiconductor layer. Moreover, according to this structure, in a case where the lattice constant of the active layer is larger than that of the semiconductor layer, the lattice constant of the nitride semiconductor layer is smaller than that of the semiconductor layer. Accordingly, tensile strain, which is opposite to the compression strain in a direction along the main surface of the active layer, can be caused in the nitride semiconductor layer due to the lattice constant difference between the semiconductor layer and the active layer. As a result stress generated in the nitride semiconductor layer easily can compensate for stress generated in the active layer.

In the semiconductor device according to the second aspect of the present invention, the nitride semiconductor layer is preferably formed in such a way to come into contact with an upper surface of the semiconductor layer being at the side of the active layer side. According to this structure, dislocation which exists in the semiconductor layer can be bent by the nitride semiconductor layer formed on the surface of the active layer of the semiconductor layer. As a result, it is possible to effectively suppress dislocation from being propagated to the semiconductor device layers formed on the nitride semiconductor device.

In the semiconductor device according to the second aspect of the present invention, the nitride semiconductor layer is preferably formed of an altered layer that is made of an altered surface of the semiconductor substrate on the active layer side. According to this structure, it is possible to form the nitride semiconductor layer, which causes strain that can compensate for strain that occurs between the semiconductor layer and the active layer, not through the crystal-growth of the nitride semiconductor layer on the semiconductor layer.

DETAILED DESCRIPTION OF THE PREFERRED EMBODIMENTS

The following will explain embodiments of the present invention with reference to the drawings.

First Embodiment

Figure 1:
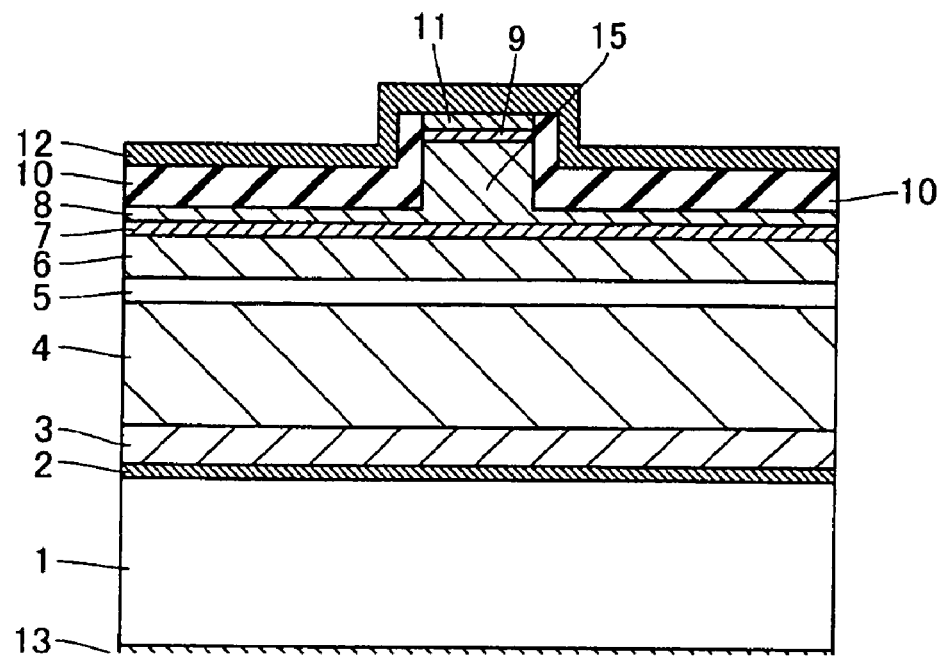
FIG. 1 is a cross-sectional view illustrating a structure of a nitride semiconductor laser device according to a first embodiment of the present invention.
Figure 2:
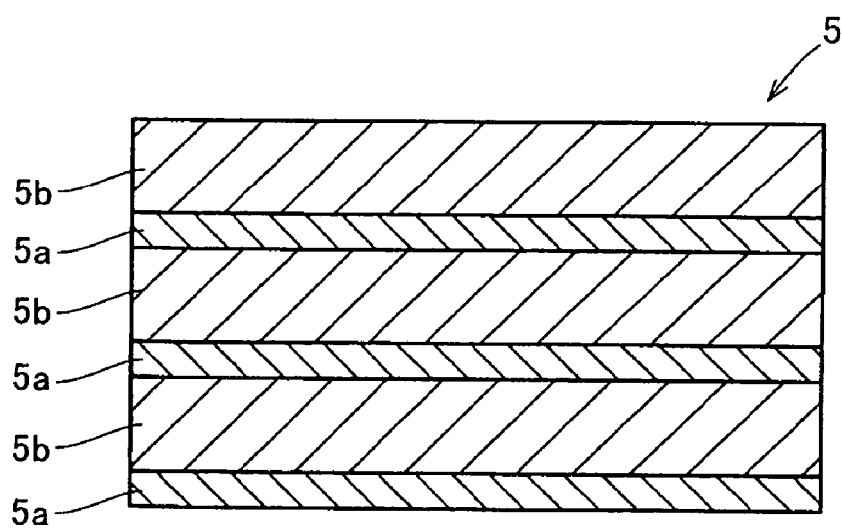
FIG. 2 is a cross-sectional view illustrating a structure of an active layer of the nitride semiconductor laser device according to the first embodiment illustrated in FIG. 1.

FIG. 1 is a cross-sectional view illustrating a structure of a nitride semiconductor laser device (semiconductor device) according to a first embodiment of the present invention. FIG. 2 is a cross-sectional view illustrating a structure of an active layer of the nitride semiconductor laser device according to the first embodiment illustrated in FIG. 1. First, an explanation will be given of the structure of the nitride semiconductor laser device according to the first embodiment with reference to FIGS. 1 and 2.

In the nitride semiconductor laser device according to the first embodiment, as illustrated in FIG. 1, on an AlGaN substrate 1, made of $Al_{0.07}Ga_{0.93}N$ with a thickness of about 100 µm, there is formed a high Al composition layer 2 made of undoped $Al_{0.15}Ga_{0.85}N$ with a thickness of about 0.5 nm to 20 nm. The high Al composition layer 2 is an example of the "nitride semiconductor layer" of the present invention. Also, the AlGaN substrate 1 is an example of the "semiconductor substrate" of the present invention.

Here, in the first embodiment, the high Al composition layer 2 is formed of two kinds of group III elements, that is, Al and Ga, and N. In addition, the high Al composition layer 2 and AlGaN substrate 1 are formed of the same constituent elements (Al, Ga and N). Moreover, an Al composition ratio of the high Al composition layer (15%) is set to be higher than the Al composition ratio of the AlGaN substrate 1 (7%). Furthermore, the high Al composition layer 2 is formed in such a way to come into contact with the AlGaN substrate 1.

On the high Al composition layer 2, a buffer layer 3 made of undoped $Al_{0.01}Ga_{0.99}N$ with a thickness of about 1.0 µm is formed. On the buffer layer 3, an n-type cladding layer 4 made of Ge-doped n-type $Al_{0.07}Ga_{0.93}N$ with a thickness of about 2.0 µm is formed. The n-type cladding layer 4 is formed of the same elements (Al, Ga and N) as those of the AlGaN substrate 1, and has the same Al composition ratio (7%) as that of the AlGaN substrate 1. It should be noted that the n-type cladding layer 4 is one example of "cladding layer" of the present invention. On the n-type cladding layer 4, an active layer 5 having an MQW structure is formed. The active layer 5 is formed in such a way that three quantum well layers 5a, made of undoped $In_XGa_{1-X}N$ with a thickness of about 3.5 nm, and three quantum barrier layers 5b, made of undoped $In_YGa_{1-Y}N$ with a thickness of about 20 nm, are alternately superposed on each other as shown in FIG. 2. It should be noted that X>Y, and X=0.15 and Y=0.02.

Moreover, as illustrated in FIG. 1, on the active layer 5, a p-side optical guiding layer 6 made of undoped $In_{0.01}Ga_{0.99}N$ with a thickness of about 80 nm is formed. On the p-side optical guiding layer 6, a p-side carrier blocking layer 7 made of undoped $Al_{0.2}Ga_{0.8}N$ with a thickness of about 20 nm is formed. Further, on the p-side carrier blocking layer 7, a p-type cladding layer 8 having a flat portion and a convex portion, and made of Mg-doped $Al_{0.07}Ga_{0.93}N$ as illustrated in FIG. 1 is formed. The thickness of the convex portion of the p-type cladding layer 8 is about 0.45 µm and that of the flat portion thereof other than the convex portion is about 0.05 µm. The p-type cladding layer 8 is formed of the same elements (Al, Ga and N) as those of the AlGaN substrate 1 and has the same Al composition ratio (7%) as that of the AlGaN substrate 1. It should be noted that the p-type cladding layer 8 is an example of the "cladding layer" of the present invention. On an upper surface of the convex portion of the p-type cladding layer 8, a p-side contact layer 9 made of undoped $In_{0.07}Ga_{0.93}N$ with a thickness of about 2 nm is formed. A ridge portion 15, serving as a current passage, is formed of the convex portion of the p-type cladding layer 8 and the p-side contact layer 9. The ridge portion 15 is formed in a stripe shape (a long and narrow shape) to extend in an outgoing direction of light, when viewed from the top. Furthermore, the ridge portion 15 has a width of about 1.5 µm.

Moreover, on side surfaces of the ridge portion 15 and an upper surface of the flat portion of the p-type cladding layer 8, a current blocking layer 10 made of a $SiO_2$ film with a thickness of about 0.2 µm is formed. On an upper surface of the p-side contact layer 9, a p-side ohmic electrode 1, having an Si layer with a thickness of about 1 nm, a Pd layer with a thickness of about 20 nm, and an Au layer with a thickness of about 10 nm, from bottom to top, is formed.

Furthermore, on an upper surface of the p-side ohmic electrode 1, and on an upper surface of the current blocking layer 10, a p-side pad electrode 12, having a Ti layer with a thickness of about 30 nm, a Pd layer with a thickness of about 150 nm and an Au layer with a thickness of about 3000 nm, from bottom to top, is formed in a way to come into contact with the upper surface of the p-side ohmic electrode 11.

Moreover, as illustrated in FIG. 1, on a rear surface of the AlGaN substrate 1, an n-side ohmic electrode 13, having an Si layer with a thickness of about 1 nm, an Al layer with a thickness of about 6 nm and a Pd layer with a thickness of about 30 nm, in order of increasing distance from the rear surface of the AlGaN substrate 1, is formed. On a rear surface of the n-side ohmic electrode 13, an n-side pad electrode 14 having an Au layer with a thickness about 300 nm is formed.

As mentioned above, according to the first embodiment, formed on the upper surface of the AlGaN substrate 1 made of $Al_{0.07}Ga_{0.93}N$, is the high Al composition layer 2, which is made of the same constituent elements (Al, Ga and N) as those of the AlGaN substrate 1, and which has an Al composition ratio higher than that of the AlGaN substrate. As a result, Al has a higher bonding strength to nitrogen than Ga has. Accordingly, when the buffer layer 3, which forms the nitride semiconductor laser device, is grown on the high Al composition layer 2, it is possible to easily bond nitrogen, as constituent element of the buffer layer 3, to Al of the high composition layer 2. This makes it possible to prevent pit from occurring in the buffer layer 3, which forms the nitride semiconductor laser device formed on the high Al composition layer 2. As a result, it is possible to suppress deterioration in device characteristic of the nitride semiconductor laser device.

Furthermore, according to the first embodiment, the Al composition ratio of the high Al composition layer 2 formed on the upper surface of the AlGaN substrate 1 is made higher than that of the AlGaN substrate 1 to make the high Al composition layer 2 harder than the AlGaN substrate 1. As a result, it is possible to bend dislocation which exists in the AlGaN substrate 1 at a boundary surface between the AlGaN substrate 1 and the high Al composition layer 2. By this means, it is possible to suppress dislocation which exists in the AlGaN substrate 1 from being propagated over the high Al composition layer 2 to the upper layers, that is, the buffer layer 3, the n-type cladding layer 4, the active layer 5, the p-side optical guiding layer 6, the p-side carrier blocking layer 7, the p-type cladding layer 8 and the p-side contact layer 9. This also makes it possible to suppress deterioration in device characteristic of the nitride semiconductor laser device.

Moreover, according to the first embodiment, the semiconductor device further includes the n-type cladding layer 4 and the p-type cladding layer 8, each formed of the same constituent elements as those of the AlGaN substrate 1, thereby making it possible to reduce the lattice constant difference between the AlGaN substrate 1, and each of the n-type cladding layer 4 and the p-type cladding layer 8. It is thereby possible to easily suppress occurrence of the warp and the crack in the substrate due to the lattice constant difference between the AlGaN substrate 1 and each of the n-type cladding layer 4 and the p-type cladding layer 8.

Furthermore, according to the first embodiment, the high Al composition layer 2 is formed in such a way to come into contact with the upper surface of the AlGaN substrate 1, thereby making it possible to bend dislocation which exists in the AlGaN substrate 1 by the Al high composition layer 2 formed immediately above the AlGaN substrate 1. As a result, it is possible to effectively suppress dislocation which exists in the AlGaN substrate 1 from being propagated over the high Al composition layer 2 to the upper layers, that is, the buffer layer 3, the n-type cladding layer 4, the active layer 5, the p-side optical guiding layer 6, the p-side carrier blocking layer 7, the p-type cladding layer 8 and the p-side contact layer 9.

FIGS. 3 to 6 are cross-sectional views each explaining a manufacturing process of the nitride semiconductor laser device according to the first embodiment shown in FIG. 1. The manufacturing process of the nitride semiconductor laser device according to the first embodiment will be explained with reference to FIG. 1 and FIGS. 3 to 6.

Figure 3:
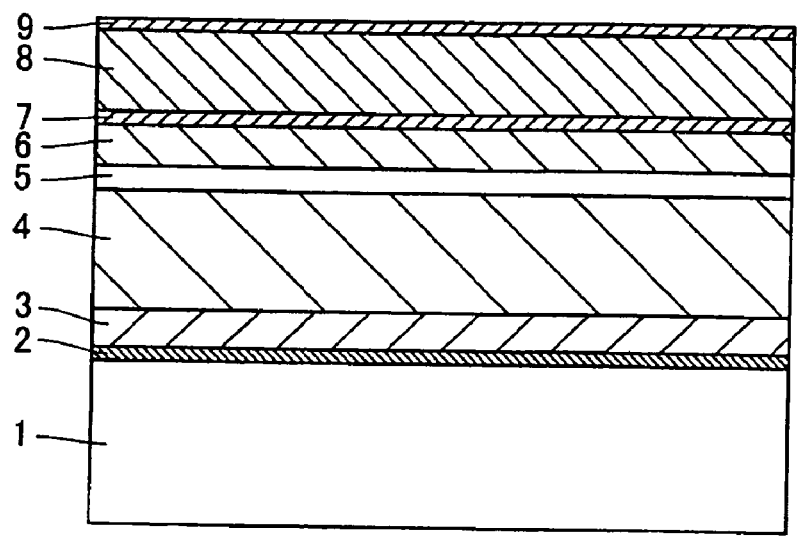
FIG. 3 is a cross-sectional view explaining a manufacturing process of the nitride semiconductor laser device according to the first embodiment illustrated in FIG. 1.

First, as illustrated in FIG. 3, the high Al composition layer 2, the buffer layer 3, the n-type cladding layer 4, the active layer 5, the p-side optical guiding layer 6, the p-side carrier blocking layer 7, the p-type cladding layer 8 and the p-side contact layer 9 are sequentially grown on the AlGaN substrate 1 made of $Al_{0.07}Ga_{0.93}N$ by Metal-Organic Vapor Phase Epitaxy (MOVPE) method.

Specifically, the AlGaN substrate 1 is inserted into a reactor in an atmosphere of $H_2$ and $NH_3$ and is heated up to a single crystal growth temperature of about 1000° C. to 1200° C. (for example, about 1150° C.) with $NH_3$ gas supplied thereto. When the temperature of AlGaN substrate 1 reaches 1150° C., the high Al composition layer 2, which is made of undoped $Al_{0.15}Ga_{0.85}N$ and which has a thickness of about 0.5 nm to 20 nm, is grown on the (0001) surface of the AlGaN substrate 1 using a carrier gas of hydrogen and a source gas including trimethyl gallium (TMGa) and trimethyl aluminum (TMAl). Next, with the AlGaN substrate 1 maintained at 1150° C., the buffer layer 3, which is made of undoped $Al_{0.01}Ga_{0.99}N$ and which has a thickness of about 1.0 μm, is grown on the high Al composition layer 2. Thereafter, with the AlGaN substrate 1 maintained at 1150° C., the n-type cladding layer 4, which is made of doped $Al_{0.07}Ga_{0.93}N$ and which has a thickness of about 2.0 μm, is grown on the buffer layer 3, using a carrier gas of hydrogen and a source gas including TMGa, TMAl and GeH4 (monogermane), which is a raw material of Ge impurity for obtaining n-type conductivity.

Next, with the AlGaN substrate 1 maintained at 850° C., formed on the n-type cladding layer 4, is the active layer 5 with the MQW structure in which the three quantum well layers 5a, made of undoped $In_{0.15}Ga_{0.85}N$ with a thickness of about 3.5 nm, and three quantum barrier layers 5b, made of undoped $In_{0.02}Ga_{0.98}N$ with a thickness of about 20 nm, are alternately grown each other, using a source gas including triethyl gallium (TEGa) and trimethyl indium (TMIn).

Next, with the AlGaN substrate 1 maintained at 850° C., the p-side optical guiding layer 6, which is made of undoped $In_{0.01}Ga_{0.99}N$ and which has a thickness of about 80 nm, is grown on the active layer 5. Next, the carrier blocking layer 7, which is made of $Al_{0.25}Ga_{0.75}N$ and which has a thickness of about 20 nm, is grown on the p-side optical guiding layer 6, using a source gas including TMGa and TMAl.

Next, in the atmosphere of $H_2$ and $NH_3$, with the AlGaN substrate 1 maintained at 1150° C., the p-typed cladding layer 8, which is made of Mg-doped $Al_{0.07}Ga_{0.93}N$ and which has a thickness of about 0.45 μm, is grown on the carrier block 7, using a source gas including $Cp_2Mg$, which is a raw material of Mg of p-type impurity, TMGa, and TMAl.

Next, in the atmosphere of $NH_3$, with the AlGaN substrate 1 maintained at 850° C., the p-side contact layer 9, made of undoped $In_{0.07}Ga_{0.93}N$ with a thickness of about 2 nm, is grown on the p-type cladding layer 8 using a source gas including TEGa and TMIn.

Figure 4:
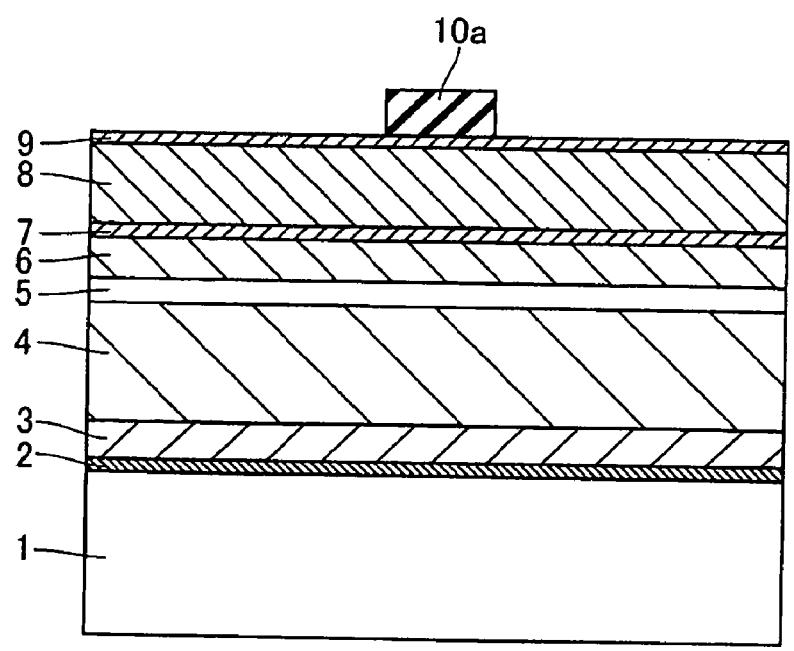
FIG. 4 is a cross-sectional view explaining a manufacturing process of the nitride semiconductor laser device according to the first embodiment illustrated in FIG. 1.
Figure 5:
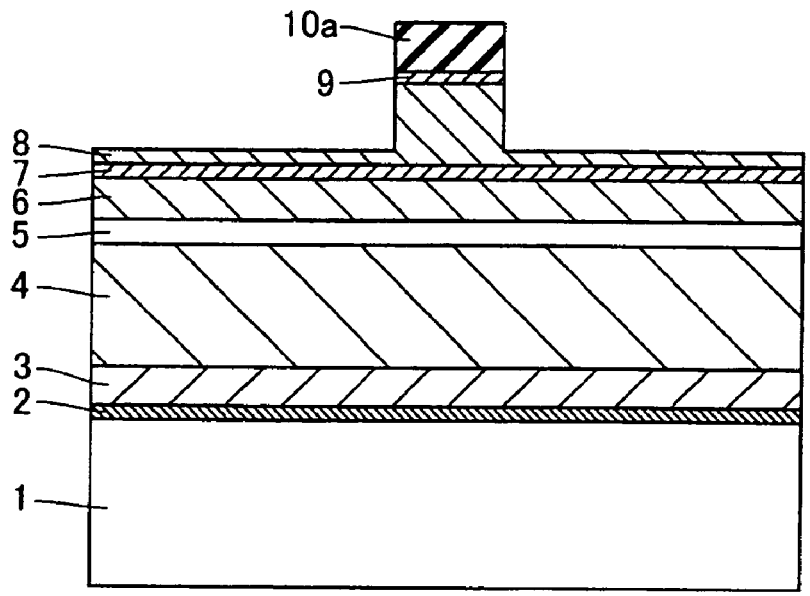
FIG. 5 is a cross-sectional view explaining a manufacturing process of the nitride semiconductor laser device according to the first embodiment illustrated in FIG. 1.

Thereafter, as illustrated in FIG. 4, a $SiO_2$ film 10a, which has a width of about 1.5 μm, is formed on the p-side contact layer 9 by plasma CVD method, or the like. Then, the $SiO_2$ film 10a is used as a mask and the p-side contact layer 9 and the p-type cladding layer 8 are partially etched by reactive ion etching (RIE) method using $Cl_2$ gas. Thus, the ridge portion 15, which is made of the p-side contact layer 9 and a convex portion of the p-type cladding layer 8, is formed as is illustrated in FIG. 5. In this case, etching depth is controlled in such a way that the convex portion of the p-type cladding layer 8 has a thickness of about 0.45 μm and the flat portion of the p-type cladding layer 8 has a thickness of about 0.05 μm. After that, the $SiO_2$ film 10a is removed.

Figure 6:
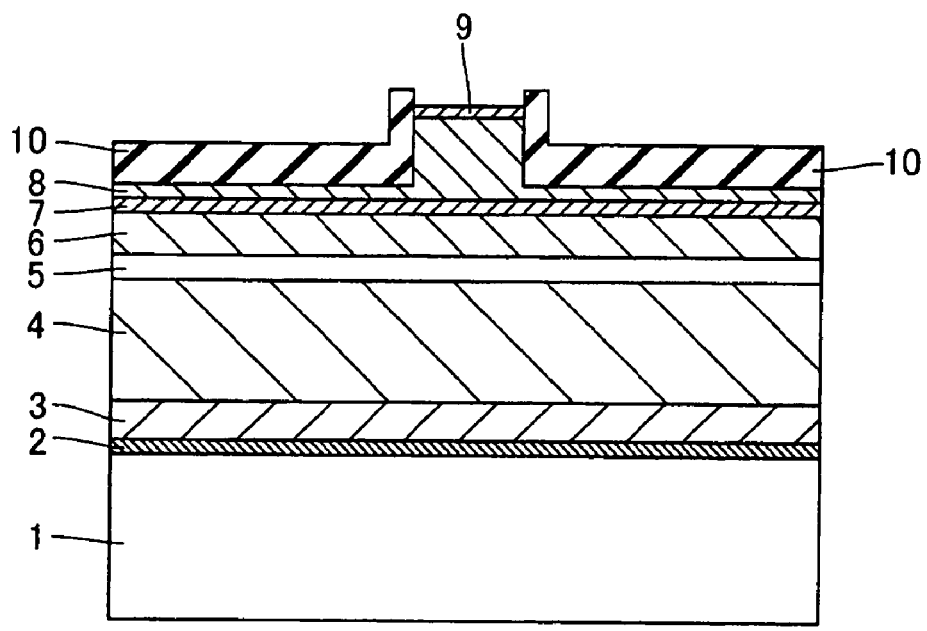
FIG. 6 is a cross-sectional view explaining a manufacturing process of the nitride semiconductor laser device according to the first embodiment illustrated in FIG. 1.

Next, as illustrated in FIG. 6, after a $SiO_2$ film with a thickness of about 0.2 μm is formed on the entire surface by plasma CVD method, the $SiO_2$ film is partially removed in such a way that the upper surface of the p-side contact layer 9 is exposed by lithography technique and RIE method using $Cl_2$ gas. As a result, the current blocking layer 10, made of the $SiO_2$ film, is formed.

Next, as illustrated in FIG. 1, on the upper surface of the p-side contact layer 9, the p-side ohmic electrode 11, which has an Si layer with a thickness of about 1 nm, a Pd layer with a thickness of about 20 nm, and an Au layer with a thickness of about 10 nm, from bottom to top, is formed by electron beam heating evaporation method. Then, on the upper surface of the p-side ohmic electrode 11, and the upper surface of the current blocking layer 10, the p-side pad electrode 12, which has a Ti layer with a thickness of about 30 nm, a Pd layer with a thickness of about 150 nm, and an Au layer with a thickness of about 3000 nm, from bottom to top, is formed in such a way to come into contact with the upper surface of the p-side ohmic electrode 11 by electron beam heating evaporation method. Then, the rear face of the AlGaN substrate 1 is polished so that the substrate 1 could be easily cleaved. After that, as illustrated in FIG. 1, the n-side ohmic electrode 13, having a Si layer with a thickness of about 1 nm, an Al layer with a thickness of about 6 nm and a Pd layer with a thickness of about 30 nm in order of increasing distance from the rear surface of the AlGaN substrate 1, is formed using electron beam heating evaporation method. Then, on the rear surface of the n-side ohmic electrode 13, the n-side pad electrode 14, having an Au layer with a thickness about 300 nm is formed. Thus completes the nitride semiconductor laser device according to the first embodiment as illustrated in FIG. 1.

Second Embodiment

Figure 7:
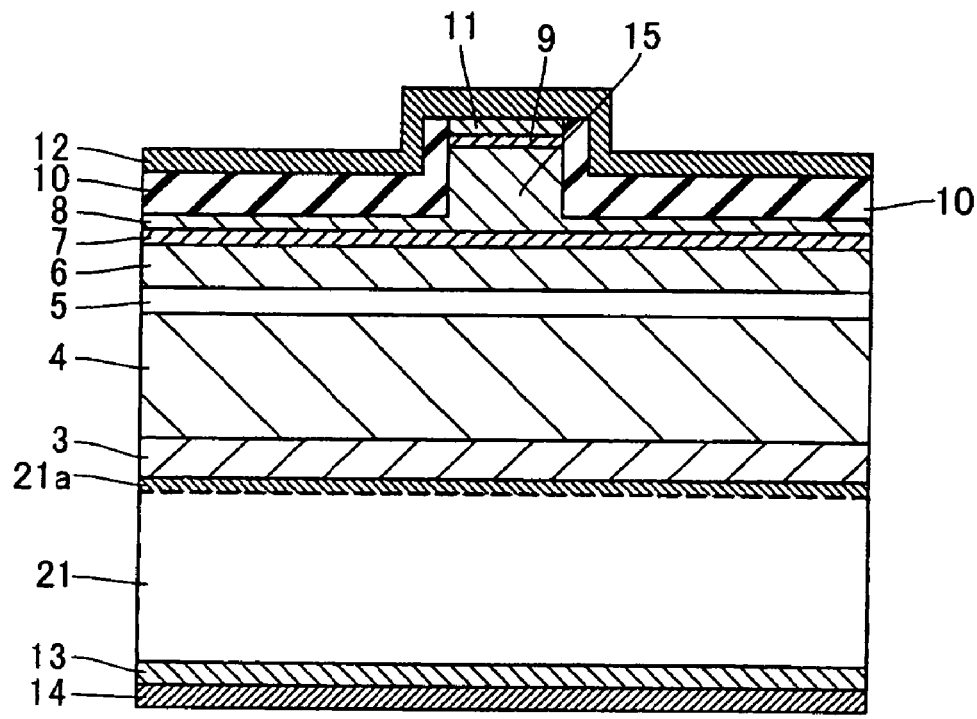
FIG. 7 is a cross-sectional view illustrating a structure of a nitride semiconductor laser device according to a second embodiment of the present invention.

FIG. 7 is a cross-sectional view illustrating a structure of a nitride semiconductor laser device according to a second embodiment of the present invention. With reference to FIG. 7, in the second embodiment, explanations will be given of a structure of the nitride semiconductor laser device of a case where a high Al composition layer 21a is formed of an altered layer made by alternating a surface of the AlGaN substrate 21, which is not like the first embodiment. In addition, the rest of the structure, other than the AlGaN substrate 21 and the Al composition layer 21a, of the second embodiment is the same as that of the first embodiment. Therefore, only the high composition layer 21a will be explained, and the explanation of the rest of the structure will be omitted. It should be noted that the AlGaN substrate 21 is an example of the "semiconductor substrate" of the present invention.

In the second embodiment, as illustrated in FIG. 7, the high Al composition layer 21a is formed on the upper surface of the AlGaN substrate 21 made of $Al_{0.07}Ga_{0.93}N$ with a thickness about 100 μm. It should be noted that the high Al composition layer 21a is an example of the "nitride semiconductor layer" of the present invention. The high Al composition layer 21a is formed of an altered layer made by a surface, which is altered to thereby increase the Al composition ratio, of the AlGaN substrate 21 made of $Al_{0.07}Ga_{0.93}N$. Moreover, the Al composition ratio, within the altered layer, is gradually increased from the boundary surface between the AlGaN substrate 21 and the altered layer (Al composition ratio 7%) to the upper surface of the altered layer. The Al composition ratio is the highest in the vicinity of the upper surface of the altered layer and the value of that part is about 20%. In addition, the thickness of the high Al composition layer 12a is about 2 nm.

As mentioned above, in the second embodiment, the high Al composition layer 21a is formed of the altered layer that is a surface of the AlGaN substrate 21 being altered. This makes it possible to form the high Al composition layer 21a which can suppress occurrence of pit and propagation of dislocation, not through the crystal-growth of the high Al composition layer 21a on the AlGaN substrate 21.

Other effects of the second embodiment are the same as those of the first embodiment.

The manufacturing process of the nitride semiconductor laser device according to the second embodiment will be explained. First, the AlGaN substrate 21 made of $Al_{0.07}Ga_{0.93}N$ is inserted into the reactor in an atmosphere of $H_2$ and $NH_3$ and is heated up to between about 1000° C. and about 1200° C. (for example, about 1150° C.) with $NH_3$ gas, which is a source of nitrogen to the nitride semiconductor layer, being supplied thereto. In this case, a flow rate of $NH_3$ is set to about 3 SLM (Standard Liter per Minute: the flow rate in liter per minute at 25° C. under atmospheric pressure). The 3-SLM flow rate corresponds to about 50% of the flow rate necessary for AlGaN growth (about 6 SLM). The temperature of the substrate is increased up to about 1150° C. with a low flow rate of $NH_3$. Thus, N and Ga on the surface of the AlGaN substrate 21 made of $Al_{0.07}Ga_{0.93}N$ are desorbed from the AlGaN substrate 21 by heat, while thermally stable Al is not desorbed from but remains in the AlGaN substrate 21. In this way, the surface of the AlGaN substrate 21 made of $Al_{0.07}Ga_{0.93}N$ is altered, and the high Al composition layer 21a made of an AlGaN layer (altered layer) with a high Al composition ratio, is formed.

Next, with the AlGaN substrate 21 maintained at 1150° C., the buffer layer 3, which is made of undoped $Al_{0.01}Ga_{0.99}N$ and has a thickness of about 1.0 μm, is grown on the high Al composition layer 21a using a carrier gas of hydrogen and a source gas including TMGa and TMAl.

The rest of the manufacturing process of the second embodiment after the formation of the buffer layer 3 is the same as that of the first embodiment.

In addition to the aforementioned method of the second embodiment, the high Al composition layer 21a made of the altered layer can be formed, by the following three methods, on the surface of the AlGaN substrate 21 by alternating the surface of the AlGaN substrate 21. The three methods are explained below as a first modification to a third modification of the second embodiment.

The method using the first modification of the second embodiment will be explained as follows. The AlGaN substrate 21 made of $Al_{0.07}Ga_{0.93}N$ is inserted into the reactor in an atmosphere of $H_2$ and $NH_3$, and is heated up to between about 1000° C. and about 1200° C. (for example, about 1150° C.) with $H_2$ of about 40 SLM being supplied thereto. The 40 SLM of $H_2$ is twice as much as the flow rate of $H_2$ necessary for growth of the nitride semiconductor layer (about 20 SLM). The AlGaN substrate 21 is heated up to about 1150° C. with a high flow rate of $H_2$. Thus, N and Ga on the surface of the AlGaN substrate 21 made of $Al_{0.07}Ga_{0.93}N$ are desorbed from the AlGaN substrate 21 by the heat. Meanwhile, thermally stable Al is not desorbed from but remains in the AlGaN substrate 21. In this way, the surface of the AlGaN substrate 21 made of $Al_{0.07}Ga_{0.93}N$ is altered and the high Al composition layer 21a, which is an AlGaN layer with a high Al composition ratio (altered layer), is formed.

The method using the second modification of the second embodiment will be explained as follows. the AlGaN substrate 21 made of $Al_{0.07}Ga_{0.93}N$ is inserted into the reactor in an atmosphere of $H_2$ and $NH_3$ and is heated up to between about 1000° C. and about 1200° C. (for example, about 1150°

C.). After the temperature of the AlGaN substrate 21 reaches about 1150° C., AlGaN substrate 21 is maintained for about five minutes with the flow rate of $NH_3$ being set to about 3 SLM, which is about 50% of the flow rate necessary for the AlGaN growth. As a result, N and Ga on the surface of the AlGaN substrate 21 made of $Al_{0.07}Ga_{0.93}N$ are desorbed from the AlGaN substrate 21 by heat. Meanwhile thermally stable Al is not desorbed from but remains in the AlGaN substrate 21. In this way, the surface of the AlGaN substrate 21 made of $Al_{0.07}Ga_{0.93}N$ is altered, and the high Al composition layer 21a, which is an AlGaN layer with a high Al composition ratio (altered layer), is formed.

The method using the third modification of the second embodiment will be explained as follows. The AlGaN substrate 21 made of $Al_{0.07}Ga_{0.93}N$ is inserted into the reactor in an atmosphere of $H_2$ and $NH_3$ and is heated up to between about 1000° C. and about 1200° C. (for example, about 1150° C.). After the temperature of the AlGaN substrate 21 reaches about 1150° C., the AlGaN substrate 21 is maintained at about 1150° C. for about five minutes, with the flow rate of $NH_3$ being set to about 40 SLM, which is twice as much as the flow rate of $H_2$ necessary for growth of the AlGaN layer. As a result, N and Ga on the surface of the AlGaN substrate 21 made of $Al_{0.07}Ga_{0.93}N$ are desorbed from the AlGaN substrate 21 by heat, while thermally stable Al is not desorbed from but remains in the AlGaN substrate 21. In this way, the surface of the AlGaN substrate 21 made of $Al_{0.07}Ga_{0.93}N$ is altered, and the high Al composition layer 21a, which is an AlGaN layer with a high Al composition ratio (altered layer) is formed.

Third Embodiment

Figure 8:
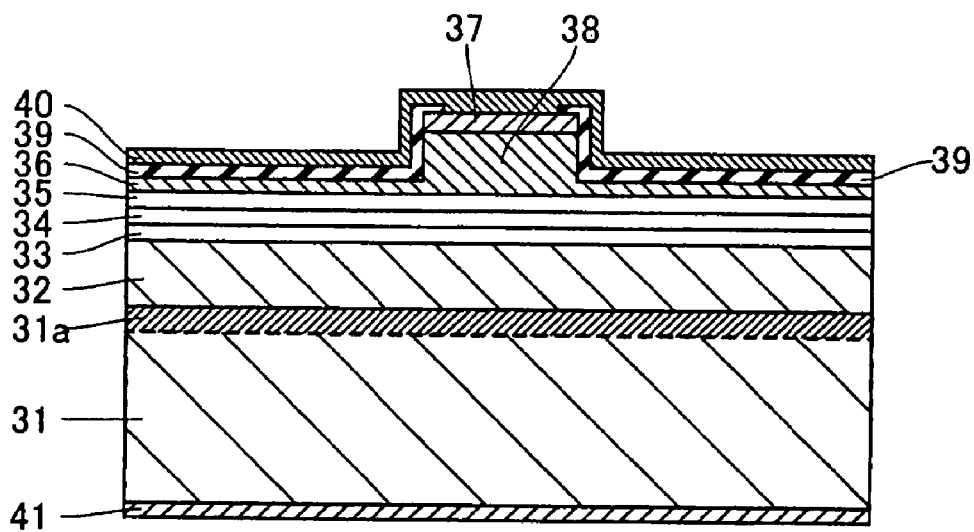
FIG. 8 is a cross-sectional view illustrating a structure of a nitride semiconductor laser device according to a third embodiment of the present invention.

FIG. 8 is a cross-sectional view illustrating a structure of a nitride semiconductor laser device (semiconductor device) according to a third embodiment of the present invention. With reference to FIG. 8, in the third embodiment, explanations will be given of a structure of a nitride semiconductor laser device of a case where a high Ga composition layer 31a is formed, on an InGaN substrate 31, as an altered layer, which is not like the first and the second embodiments.

In the nitride semiconductor laser device according to the third embodiment, as illustrated in FIG. 8, the high Ga composition layer 31a is formed on the InGaN substrate 31 made of $In_{0.15}Ga_{0.85}N$ with a thickness of about 100 µm to about 200 µm. It should be noted that the high Ga composition layer 31a is an example of the "nitride semiconductor layer" of the present invention, and that the InGaN substrate 31 is an example of "semiconductor substrate."

In the third embodiment here, the high Ga composition layer 31a is formed of an altered layer which is an altered surface of the InGaN substrate 31 made of $In_{0.15}Ga_{0.85}N$ to increase the Ga composition ratio. Moreover, within the altered layer, the Ga composition ratio is gradually increased from the boundary surface between the InGaN substrate 31 and the altered layer (Ga composition ratio 85%) to the upper surface of the altered layer. The Ga composition ratio is the highest in the vicinity of the upper surface of the altered layer and the value of that part is about 92%. Moreover, the thickness of the high Ga composition layer 31a is about 5 nm. Furthermore, the high Ga composition layer 31a is formed of the same constituent elements (In, Ga and N) as those of the InGaN substrate 31, and the Ga composition ratio in the vicinity of the surface of the high Ga composition layer 31a (92%) is set to be higher than the Ga composition ratio of the InGaN substrate 31 (85%).

Moreover, an n-type cladding layer 32, made of Si-doped $In_{0.1}Ga_{0.9}N$ with a thickness of about 1 µm, is formed on the high Ga composition layer 31a. An n-type optical waveguide layer 33, made of Si-doped $In_{0.15}Ga_{0.85}N$ with a thickness of about 50 nm, is formed on the n-type cladding layer 32. An active layer 34, having an MQW structure, is formed on the n-type optical waveguide layer 33. The active layer 34 is formed in such a way that two quantum well layers, made of $In_{0.3}Ga_{0.7}N$ and each having a thickness of about 2.5 nm, and three quantum barrier layers, made of $In_{0.17}Ga_{0.83}N$ and each having a thickness of about 15 nm, are alternately superposed on each other.

Furthermore, a p-type optical waveguide layer 35, made of undoped $In_{0.15}Ga_{0.85}N$ and having a thickness of about 50 nm, is formed on the active layer 34. Formed on the p-type optical waveguide layer 35, are a 60-period superlattice cladding layer 36 composed of an Mg-doped $In_{0.1}Ga_{0.9}N$ layer with a thickness of about 2.5 nm and a GaN layer with a thickness of about 2.5 nm. The superlattice cladding layer 36 has a flat portion and a convex portion as illustrated in FIG. 8. On the superlattice cladding layer 36, a p-type contact layer 37 made of Mg-doped GaN with a thickness of about 1 µm is formed. A ridge portion 38, serving as a current passage, is formed of the convex portion of the superlattice cladding layer 36 and the p-type contact layer 37. The ridge portion 38 is formed in a stripe shape (long and narrow shape) to extend in an outgoing direction of light, when viewed from the top.

Moreover, on part of an upper surface of the ridge portion 38, on a side surface thereof and on an upper surface of the flat portion of the superlattice cladding layer 36, a current blocking layer 39 made of an $SiO_2$ film is formed. Further, on an upper surface of the p-type contact layer 37 and on an upper surface of the current blocking layer 39, a p-side electrode 40 is formed. The p-side electrode 40 has a Ni layer and an Au layer in order of increasing distance from the p-type contact layer 37.

Moreover, as illustrated in FIG. 8, on a rear surface of the InGaN substrate 31, an n-side electrode 41 is formed. The n-side electrode has a Ti layer and an Au layer in order of increasing distance from the rear surface of the InGaN substrate 31.

As mentioned above, the Ga composition ratio of the high Ga composition layer 31a is made higher than that of the InGaN substrate 31 in the third embodiment, and Ga has a higher bonding strength to nitrogen than In. Accordingly, when the n-type cladding layer 32, which forms the nitride semiconductor laser device, is grown on the high Ga composition layer 31a, it is possible to easily bond nitrogen, which is a constituent element of the n-type cladding layer 32, to Ga of the high Ga composition layer 31 as the lower layer. This makes it possible to prevent pit from occurring in the n-type cladding layer 32, which forms the nitride semiconductor laser device, and which is formed on the high Ga composition layer 31a.

As mentioned above, in the third embodiment, the high Ga composition layer 31a is formed of the altered layer which is a surface of the InGaN substrate 31 being altered. This makes it possible to form the high Ga composition layer 31a, which can suppress occurrence of pit and propagation of dislocation, not through the crystal-growth of the high Ga composition layer 31a on the InGaN substrate 31.

Other effects of the second embodiment are the same as those of the first embodiment.

Figure 9:
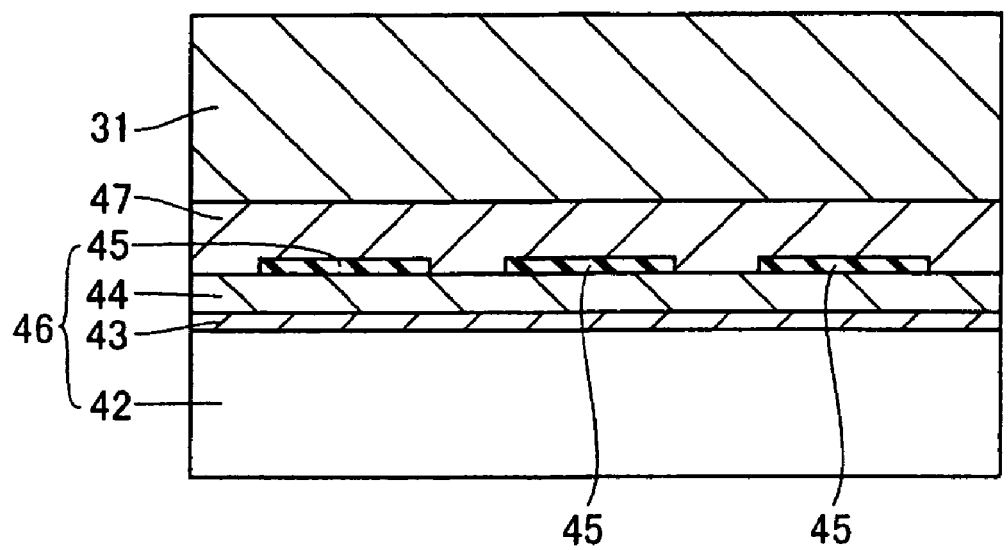
FIG. 9 is a cross-sectional view explaining a manufacturing process of the nitride semiconductor laser device according to the third embodiment illustrated in FIG. 8.
Figure 10:
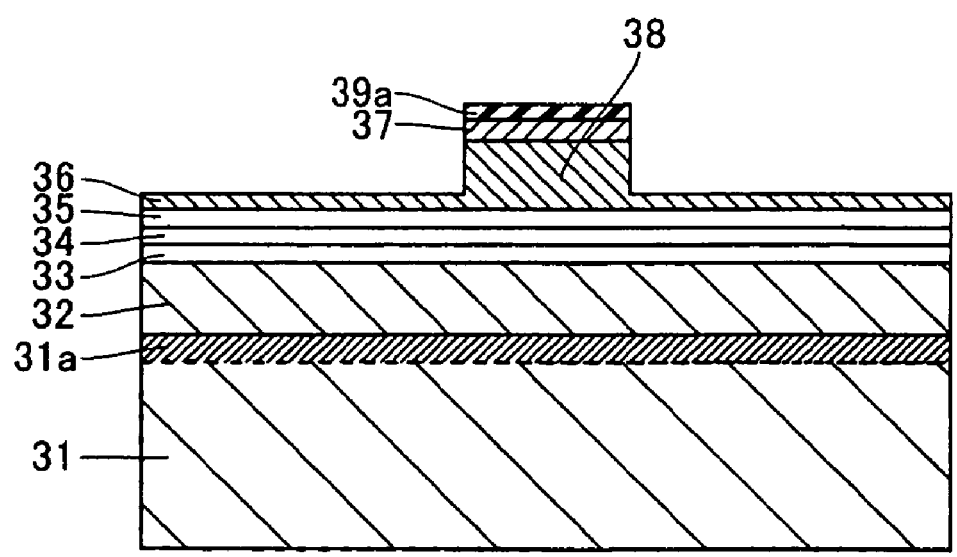
FIG. 10 is a cross-sectional view explaining a manufacturing process of the nitride semiconductor laser device according to the third embodiment illustrated in FIG. 8.
Figure 11:
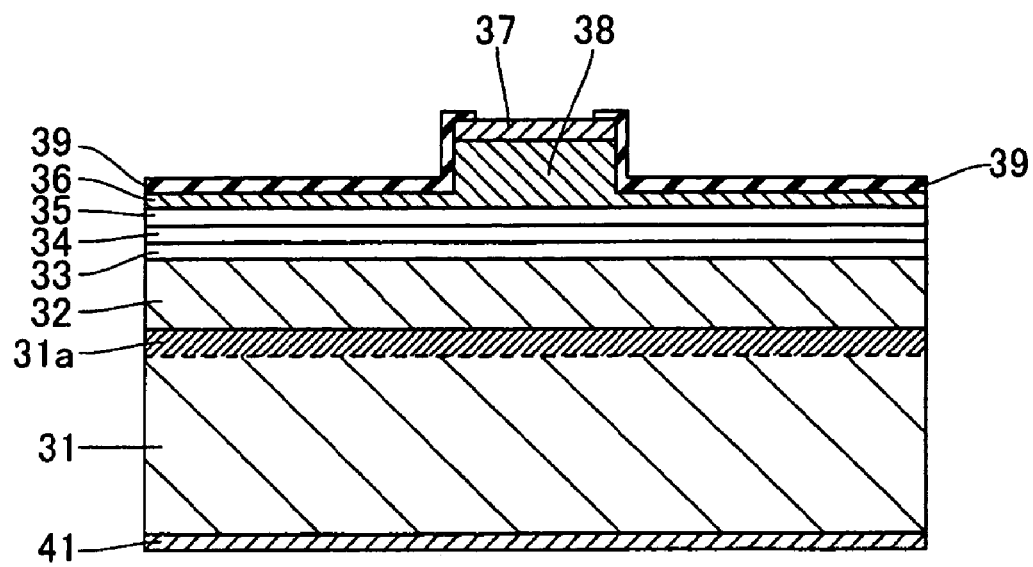
FIG. 11 is a cross-sectional view explaining a manufacturing process of the nitride semiconductor laser device according to the third embodiment illustrated in FIG. 8.

FIGS. 9 to 11 are cross-sectional views each explaining a manufacturing process of the nitride semiconductor laser device according to the third embodiment shown in FIG. 8. With reference to FIGS. 8 to 11, the manufacturing process of the nitride semiconductor laser device according to the third embodiment will be explained as follows.

First, as illustrated in FIG. 9, a low temperature buffer layer 43 and a GaN layer 44 are sequentially grown on a GaAs substrate 42 as a growth substrate by Halide Vapor Phase Epitaxy (HVPE) method.

Specifically, the low temperature buffer layer 43, made of GaN and having a thickness of about 20 nm, is grown with the GaAs substrate 42 being maintained at about 500° C. Subsequently, the GaN layer 44 with a thickness of about 2 µm is grown with the temperature being maintained at about 1050° C.

Next, a $SiO_2$ film 45 is formed on the GaN layer 44 by plasma CVD method or the like. Thereafter, holes, each having a diameter of 2 µm, are formed in a square lattice pattern with a period of about 10-µm intervals by a general lithography technique. By this means, a substrate for selective growth 46, including the GaAs substrate 42, the low temperature buffer layer 43, the GaN layer 44, and the $SiO_2$ film 45, is formed.

Thereafter, as illustrated in FIG. 9, an InGaN layer 47, made of $In_{0.1}Ga_{0.9}N$ and having a thickness of about 20 µm, is selectively laterally grown on the GaN layer 44 and the $SiO_2$ film 45 with the substrate for selective growth 46 being maintained at about 750° C. In this case, by the lateral growth of the InGaN layer 47, layers grown on the surface of the GaN layer 44 exposed between the $SiO_2$ films 45 are combined with each other to flatten the surface of the InGaN layer 47. Sequentially, the InGaN layer 31, made of Si-doped $In_{0.15}Ga_{0.85}N$ and having a thickness of about 200 µm, is grown with the temperature being maintained at about 750° C.

Next, the GaAs substrate 42 as a growth substrate, the low temperature buffer layer 43, the GaN layer 44, the $SiO_2$ film 45, and the InGaN layer 47 are removed by polishing to expose the rear surface of the InGaN layer 31, and the resultant is used as the InGaN substrate 31. Thereafter, a growth surface of the InGaN substrate 31 is polished by a thickness of about 0.5 µm using Chemical Mechanical Polishing (CMP). Moreover, the growth surface of the InGaN substrate 31 is removed by a thickness of about 0.5 µm using $Cl_2$ gas and the resultant growth surface of the InGaN substrate 31 is made mirrored. Then, the resultant InGaN substrate 31 is used as the InGaN substrate 31 of the nitride semiconductor laser device.

Next, as illustrated in FIG. 10, the high Ga composition layer 31a with a thickness of about 5 nm is formed on a surface (growth surface) of the InGaN substrate 31 made of $In_{0.15}Ga_{0.85}N$. Specifically, the InGaN substrate 31 made of $In_{0.15}Ga_{0.85}N$ is maintained, at about 900° C. for about 30 minutes, in an atmosphere of $NH_3$ (25%), $N_2$ (65%) and $H_2$ (10%). By this means, materials attached to the surface of the InGaN substrate 31 are desorbed from the surface of the InGaN substrate 31. In is also desorbed from the surface of the InGaN substrate 31. As a result, on the surface of the InGaN substrate 31, made of $In_{0.15}Ga_{0.85}N$, the high composition layer 31a, made of the altered layer having a higher Ga composition ratio than the InGaN substrate 31 of 85% is formed. Moreover, with the InGaN substrate 31 being maintained at about 750° C., the n-type cladding layer 32, made of Si-doped $In_{0.1}Ga_{0.9}N$ and having a thickness of about 1 µm, is grown on the InGaN substrate 31 in an atmosphere of $NH_3$ (25%) and $H_2$ (75%) by MOVPE method. Sequentially, grown on the n-type cladding layer 32 are: the n-type optical waveguide layer 33 made of Si-doped $In_{0.15}Ga_{0.85}N$; the active layer 34 with an MQW structure; the p-type optical waveguide layer 35 made of undoped $In_{0.15}Ga_{0.85}N$; the 60-period superlattice cladding layer 36, which is composed of Mg-doped $In_{0.1}Ga_{0.9}N$ layer with a thickness of about 2.5 nm and a GaN layer with a thickness of about 2.5 nm; and the p-type contact layer 37 made of Mg-doped GaN with a thickness of about 0.1 µm in this order. After that, by annealing InGaN substrate 31 in an atmosphere of nitrogen, Mg, which is a p-type impurity, is activated. In this way, the InGaN substrate 31 is converted into p-type.

Next, after a $SiO_2$ film 39a is formed on the p-type contact layer 37 by plasma CVD method, etching is performed onto the p-type contact layer 37 and the midway of the superlattice cladding layer 36 to form a stripe-shaped ridge portion 38 by lithography technique and by RIE method using $Cl_2$ gas. The thickness of the flat portion of the superlattice cladding layer 36 formed by the etching is set to be a thickness such that fundamental transverse mode oscillation can be achieved. After that, the $SiO_2$ film 39a is removed.

Next, as illustrated in FIG. 11, after a $SiO_2$ film is formed on the superlattice cladding layer 36 and on the p-type contact layer 37 by plasma CVD method, the $SiO_2$ film over the ridge portion 38 is partially removed by general lithography technique. Thus, a current blocking layer 39 is made of the resultant $SiO_2$ film.

Sequentially, as illustrated in FIG. 8, a p-side electrode 40, made of Ni and Au, is formed on the upper surface of the p-type contact layer 37 and that of the current blocking layer 39 by electron beam heating evaporation method. After polishing the rear surface of the InGaN substrate 31 to have a thickness of about 100 µm, the rear surface of the InGaN substrate 31 is dry etched by RIE method using $Cl_2$. After that, an n-side electrode 41, made of a Ti layer and an Au layer in order of increasing distance from the rear surface of the InGaN substrate 31, is formed by electron beam heating evaporation method. This completes the nitride semiconductor laser device according to the third embodiment as illustrated in FIG. 8.

Fourth Embodiment

Figure 12:
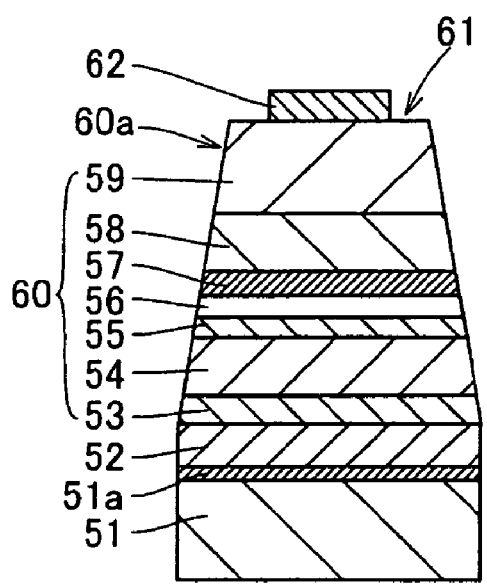
FIG. 12 is a cross-sectional view illustrating a nitride semiconductor light-emitting diode (LED) device (semiconductor device) according to a fourth embodiment of the present invention.
Figure 13:
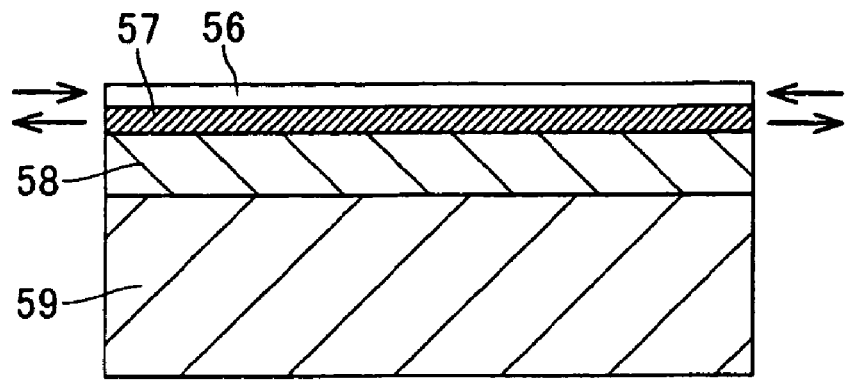
FIG. 13 is a cross-sectional view explaining a strain compensation structure of an interior of the nitride semiconductor LED device according to the fourth embodiment of the present invention illustrated in FIG. 12.

FIG. 12 is a cross-sectional view illustrating a structure of a nitride semiconductor light-emitting device (LED) according to a fourth embodiment of the present invention. FIG. 13 is a cross-sectional view explaining a strain compensation structure within the nitride semiconductor LED according to the fourth embodiment illustrated in FIG. 12. With reference to FIGS. 12 and 13, in the fourth embodiment, explanations will be given of a case where a strain compensation layer 57 is formed between an n-type cladding layer 58 made of AlGaN and an active layer 56, which is not like the first to third embodiments.

In this fourth embodiment, as illustrated in FIG. 12, a conductive support substrate 51 is provided on a side opposite to an optical outgoing surface 61. The conductive support substrate 51 is formed of Cu—W. Moreover, a p-side electrode 52, where an Ag layer with a thickness of about 200 nm and an Al layer with a thickness of about 5 nm are formed sequentially from the support substrate 51, is bonded to the entire upper surface of the support substrate 51 by a solder layer 51a. The solder layer 51a is an example of "bond layer" of the present invention. The p-side electrode 52 functions as a reflector electrode. In addition, the p-side electrode 52 is preferably formed using a metal having a low optical absorption, and formed of an electrode which reflects light.

On the p-side electrode 52, a p-type contact layer 53 made of undoped $Ga_{0.95}In_{0.05}N$ with a thickness of about 0.3 µm is formed. On the p-type contract layer 53, a p-type cladding layer 54 made of Mg-doped single crystal $Al_{0.07}Ga_{0.93}N$ with a thickness of about 0.5 μm is formed. On the p-type cladding layer 54, a protection layer 55 made of Mg-doped $Al_{0.2}Ga_{0.8}N$ with a thickness of about 10 nm is formed. On the protection layer 55, an active layer 56 having a single quantum well (SQW) structure is formed. The active layer 56 functions as a luminous layer of the LED device, and includes a well layer made of undoped $In_{0.2}Ga_{0.8}N$ with a thickness of about 5 nm. On the active layer 56, a strain compensation layer 57 made of Si-doped single crystal $Al_{0.2}Ga_{0.8}N$ with a thickness of about 5 nm is formed. The strain compensation layer 57 is an example of the "nitride semiconductor layer" of the present invention. On the strain compensation layer 57, an n-type cladding layer 58 made of Si-doped single crystal $Al_{0.07}Ga_{0.93}N$ with a thickness of about 0.5 μm is formed. The n-type cladding layer 58 is an example of the "semiconductor layer" of the present invention.

Additionally, as illustrated in FIG. 12, on the n-type cladding layer 58, an n-type contact layer 59 made of Si-doped GaN with a thickness of about 3 μm is formed. A nitride semiconductor device layer 60 is formed of the p-type contact layer 53, the p-type cladding layer 54, the protection layer 55, the active layer 56, the strain compensation layer 57, the n-type cladding layer 58, and the n-type contact layer 59.

Moreover, the nitride semiconductor device layer 60 is formed to be tapered towards the optical outgoing surface 61 from the support substrate 51 as shown in FIG. 12.

Moreover, in a predetermined region on the n-type contact layer 59, an n-side electrode 62 is formed. The n-side electrode 62 is formed of an ohmic electrode, a barrier metal, and a pad metal in order of proximity to the n-type contact layer 59. Note that the ohmic electrode, forming the n-side electrode 62, is made of Al with a thickness of about 100 nm. The barrier metal, forming the n-side electrode 62, is made of Pt or Ti which has a thickness of about 100 nm, and which suppresses reaction between the ohmic electrode and the pad metal. The pad metal, forming the n-side electrode 62, is made of Al or Au—Sn which has a thickness of about 500 nm, and which is a fusible metal. The n-side electrode 62 is not placed on the entire surface of the n-type contact layer 59, but placed in a part of the region on the n-type contact layer 59 so as not to obstruct the light outputted from the optical outgoing surface 61.

As mentioned above, according to the fourth embodiment, the strain compensation layer 57 is formed in such a way to come into contact with one of the surfaces of the n-type cladding layer 58, the one that exists between the n-type cladding layer 58, made of $Al_{0.07}Ga_{0.93}N$, and the active layer 56, made of $In_{0.2}Ga_{0.8}N$. In addition, the strain compensation layer 57 is formed of the AlGaN layer having the same constituent elements as those of the n-type cladding layer 58, and is made of $Al_{0.2}Ga_{0.8}N$ having the Al composition ratio higher than that of the n-type cladding layer 58. Accordingly, as shown in FIG. 13, the difference between the lattice constant of the strain compensation layer 57 and that of the n-type contact layer 59 causes tensile strain to occur in a direction along the main surface of the strain compensation layer 57. On the other hand, since the lattice constant of the active layer 56 is larger than that of the n-type contact layer 59, compression strain occurs in a direction along the main surface of the active layer 56. As a result, stress generated in the strain compensation layer 57 can compensate for stress generated in the active layer 56. This makes it possible to suppress generation of crystal defect in the active layer 56 of the nitride semiconductor LED device, thereby allowing improvements in luminous efficiency of the nitride semiconductor LED device and in the device life thereof (improvements in device characteristics).

According to the fourth embodiment, the Al composition ratio of the strain compensation layer 57 is made higher than that of the n-type cladding layer 58 to make the strain compensation layer 57 harder than the n-type cladding layer 58. This makes it possible to bend dislocation which exists in the n-type cladding layer 58, at a boundary surface between the n-type cladding layer 58 and the strain compensation layer 57. In this way, it is possible to suppress dislocation which exists in the n-type cladding layer 58 from being propagated over the strain compensation layer 57 to the upper layer, that is, the active layer 56. Thus, the dislocation in the active layer 56 can be reduced as compared with the conventional case. This also makes it possible to suppress deterioration in device characteristics of the nitride semiconductor diode device.

FIGS. 14 to 21 are cross-sectional views each explaining a manufacturing process of the nitride semiconductor LED device according to the fourth embodiment shown in FIG. 12. Explanations of the manufacturing process of the nitride semiconductor LED device according to the fourth embodiment will be given next with reference to FIG. 12 and FIGS. 14 to 21.

Figure 14:
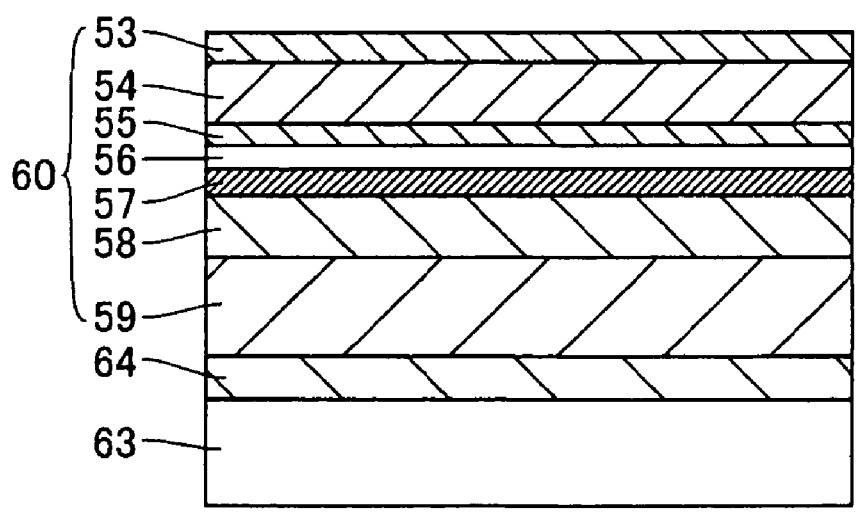
FIG. 14 is a cross-sectional view explaining a manufacturing process of the nitride semiconductor LED device according to the fourth embodiment illustrated in FIG. 12.

First, as illustrated in FIG. 14, a low temperature buffer layer 64, the n-type contact layer 59, the n-type cladding layer 58, the strain compensation layer 57, the active layer 56, the protection layer 55, the p-type cladding layer 54, and the p-type contact layer 53 are sequentially grown on a sapphire substrate 63 as a growth substrate by MOVPE method.

Specifically, with the sapphire substrate 63 being maintained at growth temperature of about 400° C. to about 700° C., the low temperature buffer layer 64, made of undoped GaN with a thickness of about 10 nm to about 50 nm, is grown on the (0001) surface of the sapphire substrate 63 using a source gas of $NH_3$ and TMGa and a dopant gas of $SiH_4$. At this time, the low temperature buffer layer 64, made of n-type AlN, may be grown using a source gas of $NH_3$ and TMAl. Also, the low temperature buffer layer 64, made of n-type AlGaN, may be grown using a source gas of $NH_3$, TMGa, and TMAl.

Next, with the sapphire substrate 63 being maintained at single crystal growth temperature of about 1000° C. to about 1200° C. (for example, about 1150° C.), the n-type contact layer 59, made of Si-doped single crystal n-type GaN having a thickness of about 3 μm and an impurity concentration of about $3 \times 10^{18}$ $cm^{-3}$, is grown on the low temperature buffer layer 64 at a growth rate of about 3 μm/h using a carrier gas of $H_2$ and $N_2$ ($H_2$ content is about 50%), a source gas of $NH_3$ and of TMGa, and a dopant gas of $SiH_4$. After that, using a different carrier gas of $H_2$ and $N_2$ ($H_2$ content is about 1% to about 3%) and a different source gas of $NH_3$, TMGa and TMAl, the n-type cladding layer 58, made of Si-doped single crystal n-type $Al_{0.07}Ga_{0.93}N$ with a thickness of about 0.5 μm, is grown on the n-type contact layer 59 at a growth rate of about 1 μm/h.

Next, the TMAl content of the source gas to be supplied is increased and the strain compensation layer 57, made of Si-doped single crystal $Al_{0.2}Ga_{0.8}N$ with a thickness of about 5 nm, is grown on the n-type cladding layer 58.

Next, with the sapphire substrate 63 being maintained at single crystal growth temperature of about 700° C. to about 1000° C. (for example, about 850° C.), the well layer, made of undoped single crystal $In_{0.2}Ga_{0.8}N$ with a thickness of about 5 nm, is grown on the strain compensation layer 57 at a growth rate of about 0.1 nm/s using a carrier gas of $H_2$ and $N_2$ ($H_2$ content is about 1% to about 5%) and a source gas of $NH_3$, TMGa and TMIn. In this way, the active layer 56 of the SQW structure including the well layer is formed. Next, the protection layer 55, made of Mg-doped single crystal $Al_{0.2}Ga_{0.8}N$ with a thickness of about 10 nm, is grown on the active layer 56 at a growth rate of about 0.3 nm/s.

Next, with the sapphire substrate 63 being maintained at single crystal growth temperature of about 1000° C. to about 1200° C. (for example, about 1150° C.), the p-type cladding layer 54, made of Mg-doped single crystal p-type $Al_{0.05}Ga_{0.95}N$ with a thickness of about 0.5 µm, is grown on the protection layer 55 at a growth rate of about 1 µm/h using a carrier gas of $H_2$ and $N_2$ ($H_2$ content is about 1% to about 3%) and a source gas of $NH_3$, TMGa and TMAl, and a dopant gas of $Cp_2Mg$.

Sequentially, with the sapphire substrate 63 being maintained at single crystal growth temperature of about 700° C. to about 1000° C. (for example, about 850° C.), using a different source gas of $NH_3$ and TMGa and TMIn and using no dopant gas, the contact layer 53, made of undoped single crystal $Ga_{0.95}In_{0.05}N$ with a thickness of about 0.3 µm, is grown on the p-type cladding layer 54 at a growth rate of about 0.1 nm/s. Thereafter, with the sapphire substrate 63 being maintained at about 400° C. to about 900° C. (for example, about 800° C.), annealing is performed in an atmosphere of $N_2$, so that hydrogen concentration of each of the aforementioned nitride semiconductor layers is reduced to about $5 \times 10^{18}$ cm$^{-3}$ or lower. Then, Mg of about $1 \times 10^{18}$ cm$^{-3}$ to about $1 \times 10^{19}$ cm$^{-3}$ is diffused into the contact layer using a carrier gas of $N_2$ and a dopant gas of $Cp_2Mg$, so that the contact layer is transformed to Mg-doped p-type contact layer 53. The nitride semiconductor device layer 60 is thus formed of the p-type contact layer 53, the p-type cladding layer 54, the protection layer 55, the active layer 56, the strain compensation layer 57, the n-type cladding layer 58, and the n-type contact layer 59. After that, heating and electronic beam processing are performed to thereby convert the p-type contact layer 53 and p-type cladding layer 54 into p-type. Note that the aforementioned layers show a basic structure of the LED. Addition or deletion of a layer is included in the range of design change as far as the layers combined function as LED.

Figure 15:
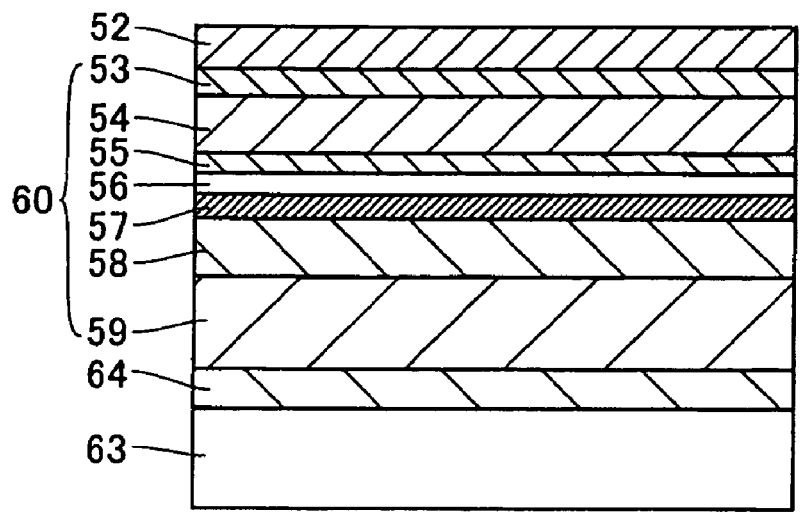
FIG. 15 is a cross-sectional view explaining a manufacturing process of the nitride semiconductor LED device according to the fourth embodiment illustrated in FIG. 12.

Next, as illustrated in FIG. 15, the p-side electrode 52, made of an Al layer and an Ag layer, is formed on the p-type contact layer 53 by vacuum evaporation method or the like. In this case, after the island-shaped Al layer with a thickness of about 5 nm is formed, the Ag layer with a thickness of about 200 nm is formed to cover the entire surface.

Figure 16:
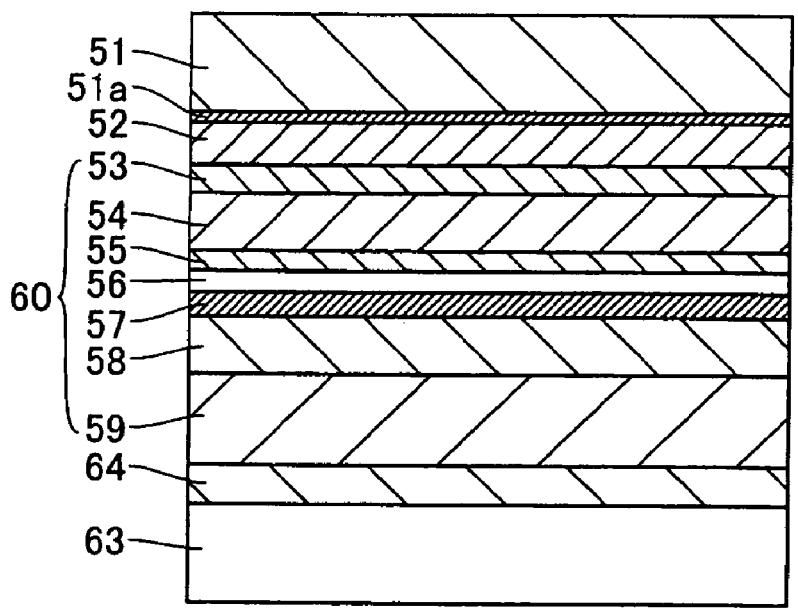
FIG. 16 is a cross-sectional view explaining a manufacturing process of the nitride semiconductor LED device according to the fourth embodiment illustrated in FIG. 12.

Next, as illustrated in FIG. 16, the support substrate 51, which is made of Cu—W and which is conductive, is bonded to the p-side electrode 52. In this case, the conductive support substrate 51 may be bonded to the p-side electrode 52 with solder such as one of Au—Sn or of Pd—Sn, or with conductive paste of Ag. Instead, the support substrate 51, having directly been adhered to the p-type electrode 52, may be bonded to the p-type electrode 52 by pressuring under a temperature condition of about 400° C. to about 1000° C.

Figure 17:
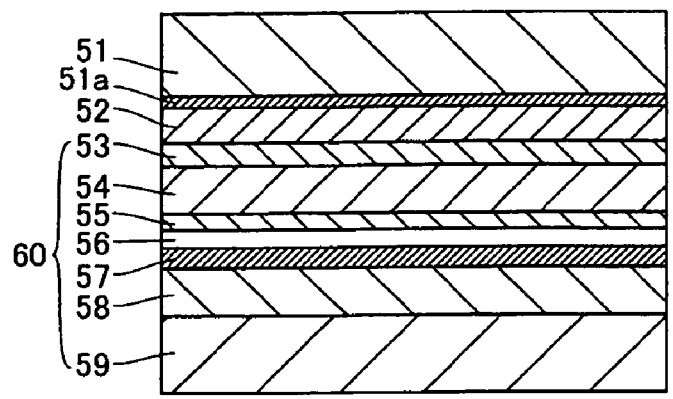
FIG. 17 is a cross-sectional view explaining a manufacturing process of the nitride semiconductor LED device according to the fourth embodiment illustrated in FIG. 12.

After that, polishing and laser irradiation are performed on the sapphire substrate 63 to remove the growth substrate of the sapphire substrate 63. Instead, the sapphire substrate 63 may be removed by dry etching technique or wet etching technique. Then, the low temperature buffer layer 64 is removed by dry etching technique using $CF_4$ gas or wet etching technique by thermal phosphoric acid. In this way, as illustrated in FIG. 17, the surface of the n-type contact layer 59 is exposed.

Figure 18:
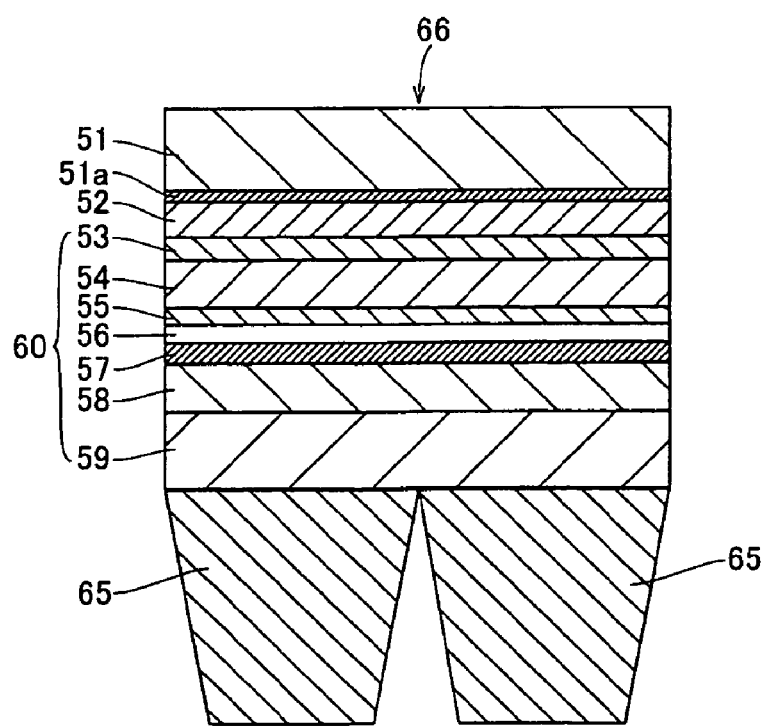
FIG. 18 is a cross-sectional view explaining a manufacturing process of the nitride semiconductor LED device according to the fourth embodiment illustrated in FIG. 12.

Next, as illustrated in FIG. 18, on the surface of the n-type contact layer 59, an Al mask layer 65 is formed. The Al mask layer 65 is shaped to have a trapezoid cross-section to be tapered towards a side opposite to the n-type contact layer 59. Specifically, first, an Al layer (not shown) with a thickness of about 2.5 µm is formed on the n-type contact layer 59 by electron beam evaporation method. After that, the Al layer is processed to have a trapezoidal shape, which is tapered towards the side opposite to the n-type contact layer 59, by photolithography technique and etching technique, thereby the mask layer 65 being formed.

Figure 19:
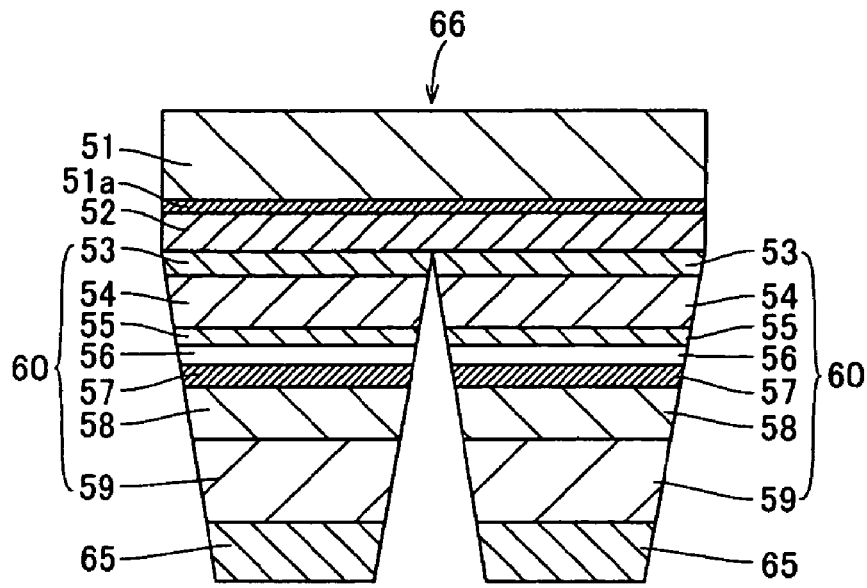
FIG. 19 is a cross-sectional view explaining a manufacturing process of the nitride semiconductor LED device according to the fourth embodiment illustrated in FIG. 12.
Figure 20:
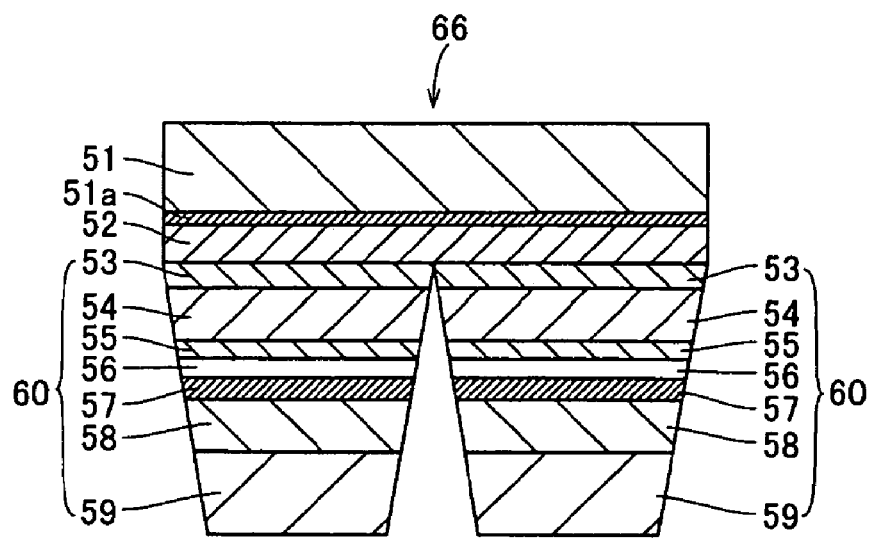
FIG. 20 is a cross-sectional view explaining a manufacturing process of the nitride semiconductor LED device according to the fourth embodiment illustrated in FIG. 12.

Next, as illustrated in FIG. 19, the mask layer 65 and the nitride semiconductor device layer 60 are simultaneously etched until an etching depth reaches the surface of the p-side electrode 52 using a parallel-plate dry etching device. In this case, as etching conditions, the discharge output and the pressure are set to about 300 W and about $6.6 \times 10^2$ Pa to about 1.3 kPa, respectively, and an etching gas of $CF_4$ is used. By setting the aforementioned etching conditions, the etching rate of the mask layer 65 and that of the nitride semiconductor device layer 60 can be substantially equalized to each other, so that the shape of the nitride semiconductor element device layer 60 reflects the shape of the mask layer 65. Namely, the nitride semiconductor device layer 60 is tapered towards the n-type contact layer 59 from the support substrate 51. At the same time, an obtuse angle is formed by an inclined side surface 60a of the nitride semiconductor device layer 60 and the surface of the n-type contact layer 59. After that, the mask layer 65 is removed using dilute hydrochloric acid, so that a shape as illustrated in FIG. 20 is obtained.

Figure 21:
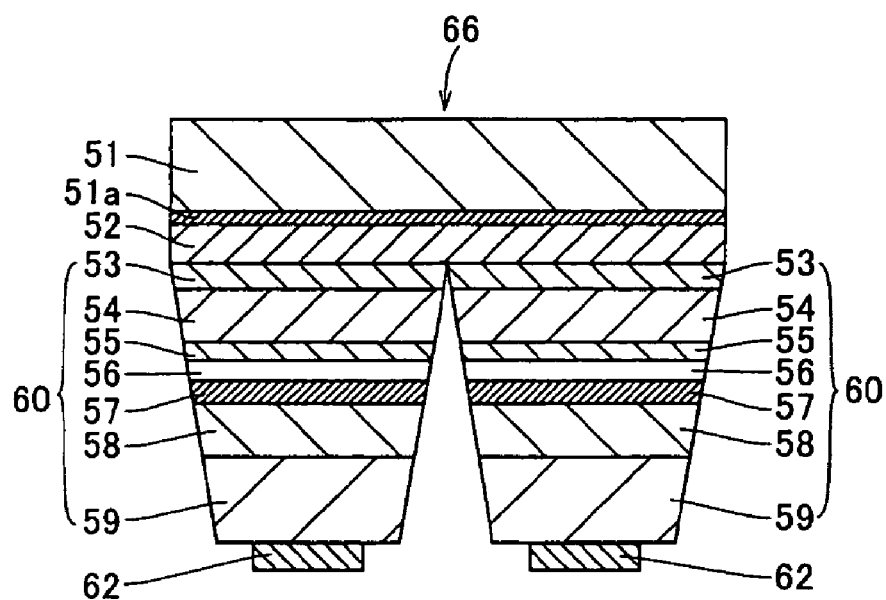
FIG. 21 is a cross-sectional view explaining a manufacturing process of the nitride semiconductor LED device according to the fourth embodiment illustrated in FIG. 12.

Next, as illustrated in FIG. 21, the n-side electrode 62 is formed in a predetermined region on the surface of the n-type contact layer 59 by vacuum evaporation method or the like. In this case, the ohmic electrode, the barrier metal, and the pad metal are formed in order of proximity to the n-type contact layer 59. In addition, the ohmic electrode, which forms the n-side electrode 62, is made of Al with a thickness of about 100 nm. Moreover, the barrier metal, which forms the n-side electrode 62, is made of Pt or Ti with a thickness of about 100 nm. Furthermore, the pad metal, which forms the n-side electrode 62, is made of Al or Au—Sn with a thickness of about 500 nm.

After that, device isolation is performed along a device isolation region 66. In this case, after a cut is made in the device isolation region 66 by dicing method, the device may be isolated along the cut. Alternatively, after a cut is made in the device isolation region 66 by etching technique, the device may be isolated along the cut. Instead of the two ways above, after a cut is made in the device isolation region 66 of the support substrate 51 by dicing method and a cut is made in the device isolation region 66 of the nitride semiconductor layer 60 by etching technique, the device may be isolated along the cut made by dicing and by the etching. Since such a combination of dicing and etching prevents a cutter from contacting the nitride semiconductor device layer 60, damage onto the nitride semiconductor device layer 60 is reduced. Thus, the nitride semiconductor LED device according to the fourth embodiment shown in FIG. 12 is formed.

In addition to the structure of the aforementioned fourth embodiment, regarding the "semiconductor layer" of the present invention may have the following structures of the first and second modifications.

The first modification of the fourth embodiment shows that the n-type cladding layer 58 and n-type contact layer 59 of the FIG. 12 are formed of a single layer of the n-type cladding layer which is made of Si-doped $Al_{0.07}Ga_{0.93}N$ with a thickness of about 3.5 µm and which serves also as the n-type contact layer. In addition, the single layer of the n-type cladding layer is an example of the "semiconductor layer" of the present invention.

In the first modification, the strain compensation layer 57 is formed, and the lattice constant of the strain compensation layer 57 is different from that of the single layer of the n-type cladding layer. The difference causes tensile strain to occur in a direction along the main surface of the strain compensation layer 57. On the other hand, since the lattice constant of the active layer 56 is larger than that of the single layer of the n-type cladding layer, compress strain occurs in a direction along the main surface of the active layer 56. As a result, stress generated in the strain compensation layer 57 can compensate for stress generated in the active layer 56.

In the second modification of the fourth embodiment, the n-type contact layer 59 of FIG. 12 is formed of Si-doped $Al_{0.01}Ga_{0.99}N$ with a thickness of about 3 μm. In addition, the high Al composition layer, made of Si-doped $Al_{0.1}Ga_{0.9}N$ with a thickness of about 5 nm, is formed between the n-type cladding layer 58 and the n-type contact layer 59. Note that the n-type contact layer 59 is an example of the "semiconductor layer" of the present invention, and the high Al composition layer is an example of the "nitride semiconductor layer".

In the second modification, the strain compensation layer 57 is formed, and the lattice constant of the strain compensation layer 57 is different from that of the n-type contact layer 59. The difference causes tensile strain to occur in a direction along the main surface of the strain compensation layer 57. On the other hand, since the lattice constant of the active layer 56 is larger than that of the n-type contact layer 59, compression strain occurs in a direction along the main surface of the active layer 56. As a result, stress generated in the strain compensation layer 57 can compensate for stress generated in the active layer 56.

Moreover, in the second modification, the Al composition ratio of the high Al composition layer is made higher than that of the n-type contact layer 59 to make the high Al composition layer harder than the n-type contact layer 59. This makes it possible to suppress dislocation which exists in the n-type contact layer 59 from being propagated over the high Al composition layer to the upper layer, that is, the n-type cladding layer 58 at the boundary surface between the n-type contact layer 59 and the high Al composition layer.

Fifth Embodiment

Figure 22:
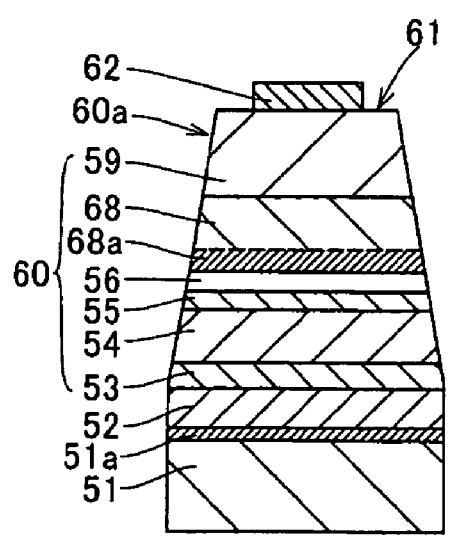
FIG. 22 is a cross-sectional view illustrating a structure of a nitride semiconductor LED device according to a fifth embodiment of the present invention.

FIG. 22 is a cross-sectional view illustrating a structure of a nitride semiconductor LED device according to the fifth embodiment of the present invention. With reference to FIG. 22, in the fifth embodiment, explanation will be given of the structure of the nitride semiconductor LED device of a case where a strain compensation layer 68a formed between an n-type cladding layer 68 and the active layer 56, is made of an altered layer of the n-type cladding layer 68, which is not like the first to fourth embodiments. In addition, in this embodiment, the rest of the structure of the nitride semiconductor LED device other than the n-type cladding layer 68 and the strain compensation layer 68a is the same that of the fourth embodiment. Therefore, the explanation of the structures except the n-type cladding layer 68 and the strain compensation layer 68a will be omitted.

In the fifth embodiment, as illustrated in FIG. 22, the strain compensation layer 68a is formed on one of the surfaces of the n-type cladding layer 68, the one that exists between the active layer 56 and the n-type cladding layer 68 made of Si-doped single crystal $Al_{0.07}Ga_{0.93}N$ with a thickness of about 0.5 μm. Note that the n-type cladding layer 68 is an example of the "semiconductor layer" of the present invention, and the strain compensation layer 68a is an example of the "nitride semiconductor layer." The strain compensation layer 68a is formed of an altered layer, which is a surface of the n-type cladding layer 68 made of $Al_{0.07}Ga_{0.93}N$ being altered to increase the Al composition ratio. Moreover, within the altered layer, the Al composition ratio is gradually increased from the boundary surface between the n-type cladding layer 68 and the altered layer (Al composition ratio 7%) to the surface of the altered layer. The Al composition ratio is the highest in the vicinity of the surface of the altered layer and the value of that part is about 15%. Moreover, the thickness of the strain compensation layer 68a is about 2 nm.

As mentioned above, in the fifth embodiment, the strain compensation layer 68a is formed of the altered layer, which is the surface of the n-type cladding layer 68 being at the side of the active layer 56 being altered. This makes it possible to form the strain compensation layer 68a, which has tensile strain in a direction along the main surface of the strain compensation layer 68a, not through the crystal-growth of the n-type cladding layer 68. On the other hand, since the lattice constant of the active layer 56 is larger than that of the n-type contact layer 59, a compression strain occurs in a direction along the main surface of the active layer 56. As a result, stress generated in the strain compensation layer 68a can compensate for stress generated in the active layer 56. Note that other effects of the fifth embodiment are the same as those of the fourth embodiment.

Explanations will be given of the manufacturing process of the nitride semiconductor laser device according to the fifth embodiment with reference to FIG. 22. Note that in the fifth embodiment, the manufacturing process of the nitride semiconductor LED device is the same as that of the fourth embodiment except for the method of forming the strain compensation layer 68a. Therefore, explanations will not be given of the common parts. In the fifth embodiment, explanations are given only of the method of forming the strain compensation layer 68a.

First, the nitride LED device, having the n-type cladding layer 68 made of $Al_{0.07}Ga_{0.93}N$, is inserted into the reactor in an atmosphere of $H_2$ and $NH_3$ and is heated up to about 1000° C. to about 1200° C. (for example, about 1150° C.) with $NH_3$ gas which is a nitrogen source of the nitride semiconductor layer, being supplied thereto. In this case, a flow rate of $NH_3$ is set to about 3 SLM corresponding to about 50% of the flow rate necessary for AlGaN growth. The temperature of the n-type cladding layer is increased up to about 1150° C. with a low flow rate of $NH_3$. As a result, N and Ga on the surface of the n-type cladding layer 68, which is at the side of the active layer 56 and which is made of $Al_{0.07}Ga_{0.93}N$, are desorbed from the n-type cladding layer 68 by heat, while thermally stable Al is not desorbed from but remains in the AlGaN n-type cladding layer 68. In this way, the surface of the n-type cladding layer 68, which is at the side of the active layer 56, and which is made of $Al_{0.07}Ga_{0.93}N$, is altered. As a result, the strain compensation layer 68a, having an AlGaN layer with a high Al composition ratio (altered layer), is formed.

The manufacturing process after forming the strain compensation layer 68a of the fifth embodiment is the same as that of the fourth embodiment.

In addition to the aforementioned method of the fifth embodiment, the following three methods, the first to third modifications are provided as a method of forming the strain compensation layer 68a by alternating a surface of the n-type cladding layer 68. The strain compensation layer 68a is made of the altered layer and is formed on the surface of the n-type cladding layer 68 being at the side of the active layer 56.

The method using the first modification of the fifth embodiment will be explained as follows. The nitride LED device, which has the n-type cladding layer 68 made of $Al_{0.07}Ga_{0.93}N$, is inserted into the reactor in an atmosphere of $H_2$ and $NH_3$, and is heated up to temperature of about 1000°

C. to about 1200° C. (for example, about 1150° C.) with $H_2$ of about 40 SLM, which is twice as much as the flow rate of $H_2$ necessary for growth of the nitride semiconductor layer, being supplied thereto. The temperature of the n-type cladding layer 68 is increased up to about 1150° C. with a high flow rate of $H_2$. By this means, N and Ga on the surface of the n-type cladding layer 68, which is at the side of the active layer 56 and which is made of $Al_{0.07}Ga_{0.93}N$, are desorbed from the surface of the n-type cladding layer 68 being at the side of the active layer 56 by heat. Meanwhile thermally stable Al is not desorbed from but remains in the AlGaN layer. In this way, the surface of the n-type cladding layer 68, which is at the side of the active layer 56 and which is made of $Al_{0.07}Ga_{0.93}N$, is altered, so that the strain compensation layer 68a, having an AlGaN layer with a high Al composition ratio (altered layer), is formed.

The method using the second modification of the fifth embodiment will be explained as follows. In order to grow the active layer 56 made of $In_{0.2}Ga_{0.8}N$ on the n-type cladding layer 68 made of $Al_{0.07}Ga_{0.93}$, the flow rate of $NH_3$ is set to about 3 SLM, which is about 50% of a flow rate necessary for AlGaN growth, when retention temperature is reduced from about 1150° C. to about 850° C. By this means, N and Ga on the surface of the n-type cladding layer 68, which is at the side of the active layer 56 and which is made of $Al_{0.07}Ga_{0.93}N$, are desorbed from the surface of the n-type cladding layer 68 being at the side of the active layer 56, by heat. Meanwhile, thermally stable Al is not desorbed from but remains in the AlGaN layer. In this way, the surface of the n-type cladding layer 68, which is at the side of the active layer 56 and which is made of $Al_{0.07}Ga_{0.93}N$, is altered, so that the strain compensation layer 68a, having an AlGaN layer with a high Al composition ratio (altered layer), is formed.

The method using the third modification of the fifth embodiment will be explained as follows. In order to grow the active layer 56 made of $In_{0.2}Ga_{0.8}N$, on the n-type cladding layer 68 made of $Al_{0.07}Ga_{0.93}$, a flow rate of $H_2$ is set to about 40 SLM, which is twice as much as a flow rate of $H_2$ necessary for AlGaN growth when retention temperature is reduced from about 1150° C. to about 850° C. By this means, N and Ga on the surface of the n-type cladding layer 68, which is at the side of the active layer 56 and which is made of $Al_{0.07}Ga_{0.93}N$, are desorbed from the surface of the n-type cladding layer 68 being at the side of the active layer 56 by heat. Meanwhile, thermally stable Al is not desorbed from but remains in the AlGaN layer. In this way, the surface of the n-type cladding layer 68, which is at the side of the active layer 56 and which is made of $Al_{0.07}Ga_{0.93}N$, is altered, so that the strain compensation layer 68a, having an AlGaN layer with a high Al composition ratio (altered layer), is formed.

Sixth Embodiment

Figure 23:
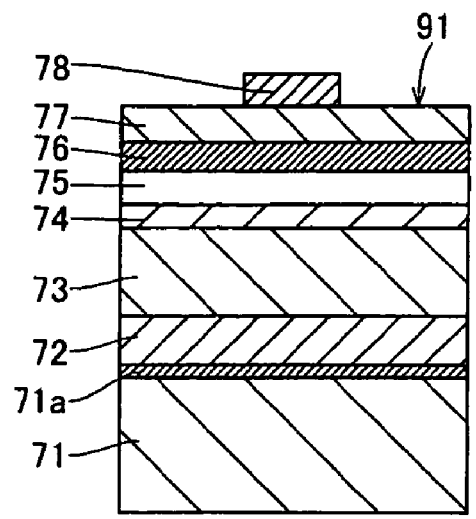
FIG. 23 is a cross-sectional view illustrating a structure of a nitride semiconductor LED device according to a sixth embodiment of the present invention.

FIG. 23 is a cross-sectional view illustrating a structure of a nitride semiconductor LED device (semiconductor device) according to a sixth embodiment of the present invention. With reference to FIG. 23, in the sixth embodiment, explanation will be given of a structure of a nitride semiconductor LED device of the case where a strain compensation layer 76 formed between an n-type cladding layer 77, made of $In_{0.1}Ga_{0.9}N$, and an active layer 75, which is not like the first to fifth embodiments.

In the sixth embodiment, as illustrated in FIG. 23, a support substrate 71, which is conductive, is provided on a side opposite to an optical outgoing surface 91. The conductive support substrate 71 is formed of Cu—W. Moreover, a p-side electrode 72 where an Ag layer with a thickness of about 200 nm and an Al layer with a thickness of about 5 nm are formed sequentially from the support substrate 71 is bonded to the entire upper surface of the support substrate 71 by a solder layer 71a. Note that, the solder layer 71a is an example of the "solder layer" of the present invention. The p-side electrode 72 functions as a reflector electrode. In addition, the p-side electrode 72 is preferably formed of a metal with a low optical absorption and is formed as an electrode which reflects light.

On the p-type electrode 72, a p-type cladding layer 73 is formed. The p-type cladding layer 73 is made of Mg-doped GaN with a thickness of about 100 nm, and serves also as a p-type contact layer. On the p-type cladding layer 73, a protection layer 74 is formed. The protection layer 74 is made of Mg-doped single crystal $Al_{0.05}Ga_{0.95}N$ with a thickness of about 5 nm. On the protection layer 74, an active layer 75 is formed. The active layer 75 has a SQW structure and is formed in such a way that two quantum well layers made of undoped single crystal $In_{0.25}Ga_{0.75}N$, and three quantum barrier layers, made of undoped single crystal $In_{0.15}Ga_{0.85}N$ are alternately superposed on each other. The thickness of each quantum well layer is about 5 nm, and that of each quantum barrier layer is about 20 nm. On the active layer 75, a strain compensation layer 76 is formed. The strain compensation layer 76 and is made of Si-doped single crystal $In_{0.02}Ga_{0.95}N$ in which the impurity concentration is about $3\times10^{18}$ $cm^{-3}$ and which has a thickness of about 5 nm. Additionally, the strain compensation layer 76 is an example of the "nitride semiconductor layer" of the present invention. On the strain compensation layer 76, an n-type cladding layer 77 is formed. The n-type cladding layer 77 is made of Si-doped single crystal $In_{0.1}Ga_{0.9}N$ and the impurity concentration of about $3\times10^{18}$ $cm^{-3}$. The n-type cladding layer 77 served also as an n-type contact layer, and has a thickness of about 1.5 μm. Note that the n-type cladding layer 77 is an example of the "semiconductor layer" of the present invention.

Moreover, an n-side electrode 78 is formed in a predetermined region on the n-type cladding layer 77. The n-side electrode 78 is formed of an ohmic electrode, a barrier metal, and a pad metal in order of proximity to the n-type cladding layer 77. The ohmic electrode, forming the n-side electrode 78, is made of Al with a thickness of about 100 nm. The barrier metal, forming the n-side electrode 78, is made of Pt or Ti with a thickness of about 100 nm, which suppresses reaction with the ohmic electrode and the pad metal. The pad metal, forming the n-side electrode 78, is made of Al or Au—Sn with a thickness of about 500 nm, which is a fusible metal. The n-side electrode 78 is not placed on the entire surface of the n-type cladding layer 77 but only in a part of the region on the n-type cladding layer 77 so as not to obstruct the light outputted from the optical outgoing surface 91.

As mentioned above, according to the sixth embodiment, the strain compensation layer 76 is formed in such a way to come into contact with one of the surfaces of the n-type cladding layer 77, the one that exists between the n-type cladding layer 77, made of $In_{0.1}Ga_{0.9}N$, and the active layer 75. In addition, the strain compensation layer 76 is formed of the InGaN layer having the same constituent elements as those of the n-type cladding layer 77, and is made of $In_{0.02}Ga_{0.98}N$ having Ga composition ratio higher than that of the n-type cladding layer 77. Accordingly, the difference between the lattice constant of the strain compensation layer 76 and that of the n-type cladding layer 77 causes tensile strain to occur in a direction along the main surface of the strain compensation layer 76. On the other hand, since the lattice constant of the active layer 75 is larger than that of the n-type contact layer 77, a compression strain occurs in a direction along the main surface of the active layer 75. As a result, stress generated in the strain compensation layer 76 can compensate for stress generated in the active layer 75. This makes it possible to suppress generation of crystal defect in the active layer 75 of the nitride semiconductor LED device, thereby allowing improvements in luminous efficiency of the nitride semiconductor LED device and in the device life thereof (improvements in device characteristics).

According to the sixth embodiment, the Ga composition ratio of the strain compensation layer 76 is made higher than that of the n-type cladding layer 77 to make the strain compensation layer 76 harder than the n-type cladding layer 77. This makes it possible to bend dislocation which exists in the n-type cladding layer 77, at a boundary surface between the n-type cladding layer 77 and the strain compensation layer 76. In this way, it is possible to suppress dislocation which exists in the n-type cladding layer 77 from being propagated over the strain compensation layer 76 to the lower layer, that is, the active layer 75. Thus, the dislocation in the active layer 75 can be reduced as compared with the conventional case. This also makes it possible to suppress deterioration in device characteristics of the nitride semiconductor diode device.

Other effects of the sixth embodiment are the same as those of the fourth embodiment.

FIGS. 24 to 28 are cross-sectional views each explaining a manufacturing process of the nitride semiconductor LED device according to the sixth embodiment shown in FIG. 23. Explanations will be given of the manufacturing process of the nitride semiconductor LED device according to the sixth embodiment with reference to FIGS. 23 to 28.

Figure 24:
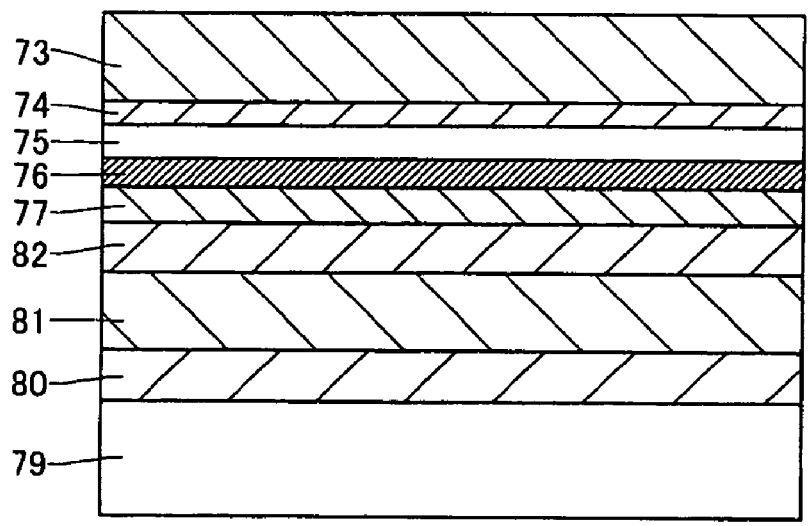
FIG. 24 is a cross-sectional view explaining a manufacturing process of the nitride semiconductor LED device according to the sixth embodiment illustrated in FIG. 23.

First, as illustrated in FIG. 24, a low temperature buffer layer 80, a GaN layer 81, an InGaN layer 82, the n-type cladding layer (n-type contact layer) 77, the strain compensation layer 76, the active layer 75, the protection layer 74, and the p-type cladding layer (p-type contact layer) 73 are sequentially grown on a sapphire substrate 79 as a growth substrate by MOVPE method.

Specifically, with the sapphire substrate 79 being maintained at growth temperature of about 400° C. to about 700° C., the low temperature buffer layer 80, made of undoped GaN with a thickness of about 10 nm to about 50 nm, is grown on the (0001) surface of the sapphire substrate 79 using a source gas of $NH_3$ and TMGa (trimethylgallium) and a dopant gas of $SiH_4$. Instead, the low temperature buffer layer 80, made of n-type AlN, may be grown using a source gas of NH3 and TMAl, or else, the low temperature buffer layer 80, made of n-type AlGaN, may be grown using a source gas of $NH_3$, TMGa, and TMAl.

Next, with the sapphire substrate 79 being maintained at single crystal growth temperature of about 1000° C. to about 1200° C. (for example, about 1150° C.), the undoped single crystal n-type GaN layer 81 with a thickness of about 3 μm is grown on the low temperature buffer layer 80 at a growth rate of about 3 μm/h using a carrier gas of $H_2$ and $N_2$ ($H_2$ content is about 50%), a source gas of $NH_3$ and TMGa, and a dopant gas of $SiH_4$. After that, with the sapphire substrate 79 being maintained at single crystal growth temperature of about 700° C., with the carrier gas being changed to the one containing only $N_2$, and with the source gas being changed to the one containing $NH_3$, TMGa and TMAl, the InGaN layer 82, made of undoped single crystal n-type $In_{0.4}Ga_{0.6}N$ with a thickness of about 50 nm, is grown on the GaN layer 81 at a growth rate of about 0.1 μm/h using a dopant gas of $SiH_4$.

Next, with the sapphire substrate 79 being maintained at single crystal growth temperature of about 500° C. to 950° C. (for example, about 800° C.), on the InGaN layer 82, the n-type cladding layer 77, also serving as an n-type contact layer, is grown using a carrier gas of $N_2$, a source gas of $NH_3$, TMGa, and TMIn, and a dopant gas of $SiH_4$ at a growth rate of about 0.8 μm/h. The n-type cladding layer 77 is made of Si-doped single crystal $In_{0.1}Ga_{0.9}N$ with an impurity concentration of about $3 \times 10^{18}$ cm$^{-3}$ and with a thickness of about 1.5 μm.

Sequentially, with the sapphire substrate 79 being maintained at single crystal growth temperature of about 500° C. to about 950° C. (for example, about 800° C.), on the n-type cladding layer 77, the strain compensation layer 76 is grown using a carrier gas of $H_2$ and $N_2$ ($H_2$ content is about 1% to about 5%), a source gas of $NH_3$, TMGa, and TMIn, and a dopant gas of $SiH_4$. The strain compensation layer 76 is made of Si-doped single crystal $In_{0.02}Ga_{0.98}N$ with an impurity concentration of about $3 \times 10^{18}$ cm$^{-3}$ and with a thickness of about 5 nm.

Next, with the sapphire substrate 79 being maintained at single crystal growth temperature of about 500° C. to about 950° C. (for example, about 750° C.), the active layer 75 is grown on the strain compensation layer 76 at a growth rate of about 0.3 μm/h using a carrier gas of $N_2$ and a source gas of $NH_3$, TEGa, and TMIn. The active layer 75 has the MQW structure in which three quantum barrier well layers, made of undoped single crystal $In_{0.15}Ga_{0.85}N$ and each having a thickness of about 20 nm, and two quantum well layers, made of undoped single crystal $In_{0.25}Ga_{0.75}N$ and each having a thickness of about 5 nm, are alternately superposed on each other. Furthermore, with the sapphire substrate 79 being maintained at single crystal growth temperature of about 800° C., on the active layer 75, the protection layer 74, made of Mg-doped single crystal $Al_{0.05}Ga_{0.95}N$ with a thickness of about 5 nm, is grown at a growth rate of about 0.4 nm/s.

After that, with the sapphire substrate 79 being maintained at single crystal growth temperature of about 1000° C. to about 1200° C. (for example, about 1150° C.), on the protection layer 74, the p-type cladding layer 73 is grown at a growth rate of about 3 μm/h, using carrier gases of $H_2$ and $N_2$ ($H_2$ content is about 1% to about 3%), a source gas of $NH_3$, TMGa, and TMIn, and a dopant gas of $Cp_2Mg$. The p-type cladding layer 73 is made of Mg-doped single crystal p-type GaN with a thickness of about 100 nm and serves also as the p-type contact layer.

Next, with the sapphire substrate 79 being maintained at about 400° C. to about 900° C. (for example, about 800° C.), annealing is performed in an atmosphere of $N_2$ to convert the p-type cladding layer (p-type contact layer) 73 into p-type. Note that the aforementioned layers show a basic structure of the LED. Addition or deletion of a layer is included in the range of design change as far as the layers combined function as LED.

Figure 25:
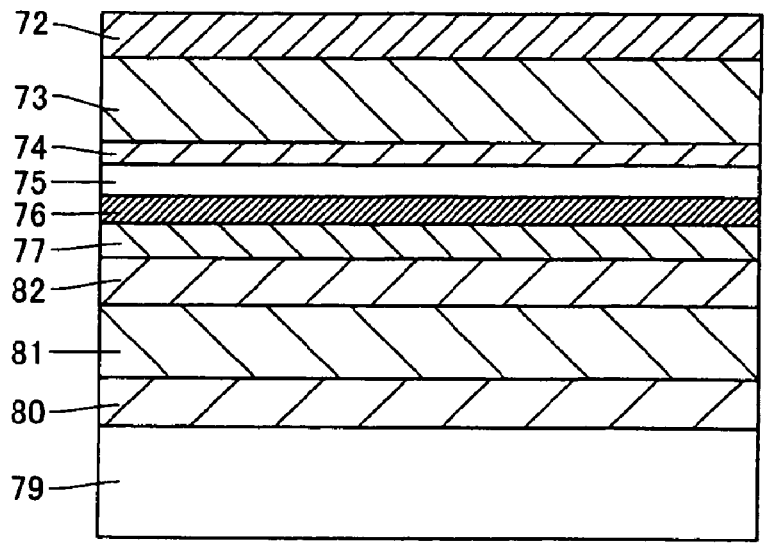
FIG. 25 is a cross-sectional view explaining a manufacturing process of the nitride semiconductor LED device according to the sixth embodiment illustrated in FIG. 23.
Figure 26:
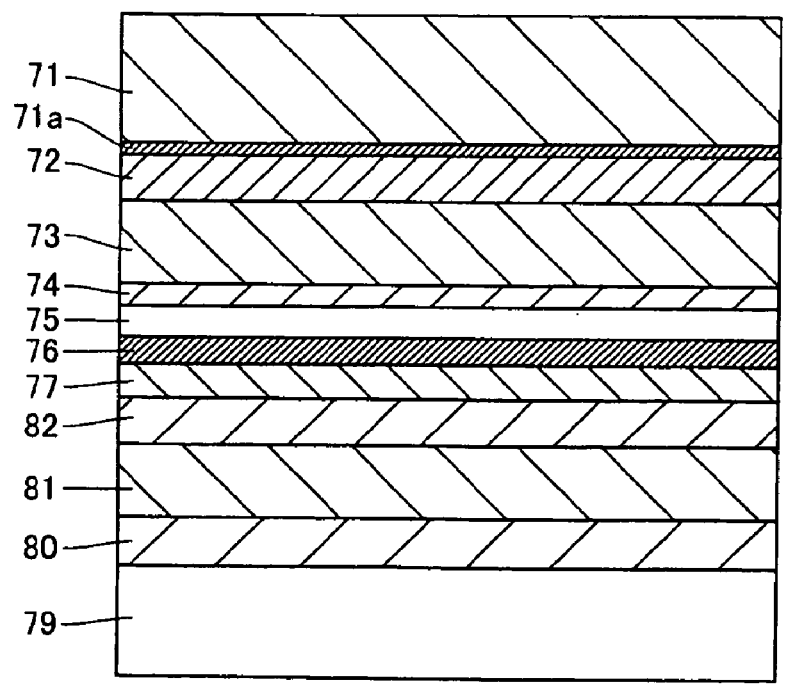
FIG. 26 is a cross-sectional view explaining a manufacturing process of the nitride semiconductor LED device according to the sixth embodiment illustrated in FIG. 23.

Next, as illustrated in FIG. 25, the p-side electrode 72 is formed on the p-type cladding layer (p-type contact layer) 73 by vacuum evaporation method or the like. Then, as illustrated in FIG. 26, the support substrate 71, which is conductive and which is made of a semiconductor, metal, a conductive resin film, or a composite material of metal and metallic oxide, is bonded to the p-side electrode 72. In this case, the support substrate 71 may be bonded to the p-side electrode 72 with solder of Au—Sn or of Pd—Sn, or with conductive paste of Ag. Moreover, after the support substrate 71 is directly adhered to the p-type electrode 72, the support substrate 71 may be bonded to the p-type electrode 72 by pressuring under a temperature condition of about 400° C. to about 1000° C.

Figure 27:
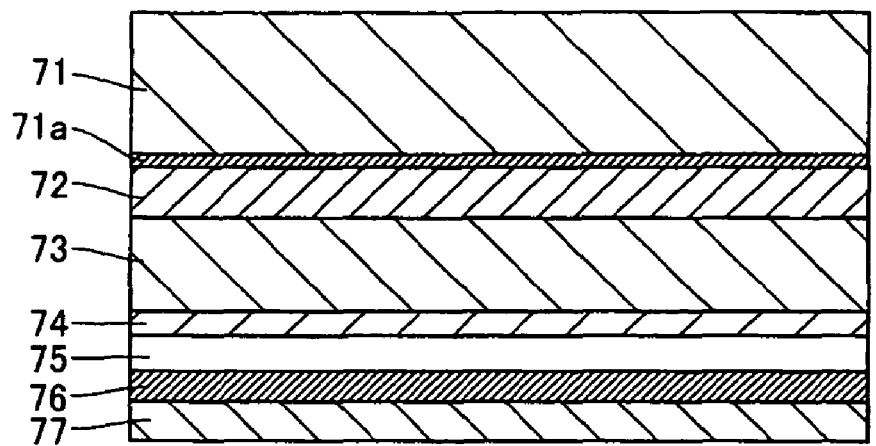
FIG. 27 is a cross-sectional view explaining a manufacturing process of the nitride semiconductor LED device according to the sixth embodiment illustrated in FIG. 23.

After that the growth substrate of the sapphire substrate 79, the low temperature buffer layer 80, the n-type GaN layer 81 and the InGaN layer 82 are removed. For that purpose, the InGaN layer 82 is evaporated by a laser beam with a wavelength of about 532 nm, which is irradiated from the sapphire substrate 79 and which is absorbed by the InGaN layer 82. Instead, the sapphire substrate 79, the low temperature buffer layer 80, the n-type GaN layer 81 and the InGaN layer 82 may be removed by dry etching or wet etching techniques. By this means, as illustrated in FIG. 27, the surface of the n-type cladding layer 77 serving also as the n-type contact layer is exposed. Then, the exposed surface of the n-type cladding layer 77 is polished by about 0.1 μm using CMP polishing. After that, $Cl_2$ gas is used to remove the exposed surface of the n-type cladding layer 77 by about 0.1 μm by RIE.

Figure 28:
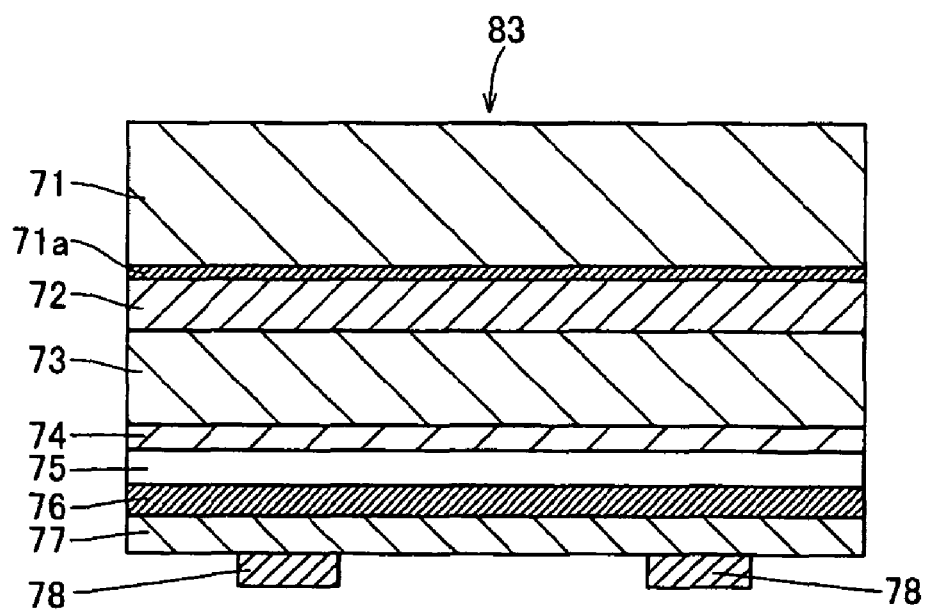
FIG. 28 is a cross-sectional view explaining a manufacturing process of the nitride semiconductor LED device according to the sixth embodiment illustrated in FIG. 23.

Next, as illustrated in FIG. 28, the n-side electrodes 78 is formed in predetermined regions on the surface of the n-type cladding layer 77 by vacuum evaporation method or the like. In this case, for each of the n-side electrodes 78, an ohmic electrode, a barrier metal, and a pad metal are formed in order of proximity to the n-type cladding layer 77. In addition, the ohmic electrode forming the n-side electrode 78 is made of Al with a thickness of about 100 nm. Moreover, the barrier metal forming the n-side electrode 78 is made of Pt or Ti with a thickness of about 100 nm which suppresses reaction with the ohmic electrode and the pad metal. Furthermore, the pad metal forming the n-side electrode 78 is made of Al or Au—Sn with a thickness of about 500 nm.

After that, device isolation is performed along a device isolation region 83. In this case, after a cut is made in the device isolation region 83 by dicing method, the device may be isolated along the cut. Alternatively, after the cut is made in the device isolation region 83 by etching technique, the device may be isolated along the cut. Instead of the two ways above, after the cut is made in the device isolation region of the nitride semiconductor LED device by etching technique, the device may be isolated along the cut by dicing method. Since such a combination of dicing method and etching technique prevents a cutter from contacting the nitride semiconductor LED device, damage onto the nitride semiconductor LED device is reduced. Thus, the nitride semiconductor LED device according to the sixth embodiment shown in FIG. 23 is formed.

It should be understood that the embodiments described above are examples for explaining the present invention in view of all points and should not be taken as limiting the scope of the present invention. The scope of the invention is indicated by the appended claims rather than the foregoing description, and all modifications that come within the meaning and range of equivalence thereof are intended to be embraced therein.

For example, the first to third embodiments show examples using the AlGaN substrate and the InGaN substrate as the nitride semiconductor substrate. However, the present invention is not limited to this, and an AlBN substrate, a BGaN substrate, an AlGaInN substrate, and an InTlN substrate may be used.

The foregoing fourth to sixth embodiments show examples of a case where a cladding layer is formed of the AlGaN layer and InGaN layer. However, the present invention is not limited to these embodiments. The cladding layer may be formed of the AlBN layer, the BGaN layer, the AlGaInN layer and the InTlN layer.

The foregoing first to third embodiments show examples of a case where an n-type nitride semiconductor substrate is used in the process of forming the nitride semiconductor laser device on the semiconductor substrate. However, the present invention is not limited to these embodiments, and a p-type nitride semiconductor substrate may be used to form the nitride semiconductor laser device.

The foregoing first to third embodiments show examples of a case where each layer of the nitride semiconductor device is crystal-grown by MOVPE method. However, the present invention is not limited to these embodiments. Each layer may be crystal-grown by HVPE method, or by gas source MBE method in which a source gas of TMAl, TMGa, $NH_3$, hydrazine, $SiH_4$, $GeH_4$, Mg $(C_5H_5)_2$ or the like is used.

The foregoing first to sixth embodiments show examples of a case where a luminous layer having the (0001) surface as the main surface is used. However, the present invention is not limited to these embodiments. It may be possible to use an active layer or a luminous layer having a (H, K,-H-K,0) surface, such as the (1-100) and the (11-20) surfaces, of the nitride semiconductor substrate, as the main surface. In this case, since no piezoelectric field occurs in the luminous layer, it is possible to improve luminous efficiency of the luminous layer.

The foregoing first to third embodiments show examples of a case where the active layer having an MQW structure is used. However, the present invention is not limited to these embodiments. A single layer of thick film having no quantum effect or an active layer having an SQW structure may be used.

The foregoing first to third embodiments show examples of a case where the present invention is applied to a semiconductor laser device. However, the present invention is not limited to these embodiments. The present invention is applicable to an LED device. In addition, the present invention is applicable to other semiconductor devices such as an electronic device, e.g., a transistor, a light receiving element, a cellular battery, and a surface acoustic wave element.

The foregoing first and second embodiments show examples of a case where the AlGaN substrate is formed to have the same Al composition ratio as the Al composition ratio (7%) of each of the n-type cladding layer and the p-type cladding layer. However, the present invention is not limited to these embodiments. Any value may be used as the Al composition ratio of the AlGaN substrate as long as the value ranges from about 2% lower to about 10% higher than the Al composition ratio of each of the n-type cladding layer and the p-type cladding layer. Specifically, for instance, if the Al composition ratio of each of the n-type cladding layer and the p-type cladding layer is about 7%, the Al composition ratio of the AlGaN substrate may range from about 4% to about 17%.

The foregoing third embodiment shows an example of a case where the high Ga composition layer, made of the altered layer, is formed on the InGaN substrate. However, the present invention is not limited to this embodiment. The high Ga composition layer may be formed on the InGaN substrate through crystal growth.

The foregoing fourth to sixth embodiments show examples of a case where the p-side electrode is formed on the entire surface of the support substrate. However, the present invention is not limited to these embodiments. The p-side electrode may be formed in parts on the support substrate. Note that, when the p-side electrode may be formed in parts on the support substrate, a layer which reflects light is preferably formed in areas where the p-side electrode is not formed. Additionally, in order to increase bonding strength to the substrate, a pad electrode is preferably formed between the p-side electrode and the support substrate. When solder is used to bond the p-side electrode to the support substrate, a barrier metal, made of Pt, Pd, or the like, is preferably formed as a protection film for the soldering side of the p-side electrode.

The foregoing fourth to sixth embodiments show examples of a case where the present invention is applied to the LED device. However, the present invention is not limited to these embodiments. The present invention is applicable to a semiconductor laser device. In addition, the present invention is applicable to other semiconductor devices such as an electronic device, e.g., a transistor, a light receiving element, a cellular battery, and a surface acoustic wave element.

The foregoing fourth to sixth embodiments show examples of a case where the support substrate is formed of Cu—W. However, the present invention is not limited to these embodiments. The conductive support substrate may be formed of a semiconductor, metal, a conductive resin film or a composite material of metal and metallic oxide. As the semiconductor to be used for the support substrate, material having cleavage such as Si, Sic, GaAs, and ZnO can be used. As the metal to be used for the support substrate, Al and Fe—Ni may be used. As the conductive resin film to be used for the support substrate, a resin film on which minute particles such as metal are dispersed can be used. As the composite material of metal and metallic oxide to be used for the support substrate, Cu—CuO can be used.

The foregoing fourth to sixth embodiments show examples of a case where the support substrate and the p-side electrode are bonded to each other through the solder layer. However, the present invention is not limited to these embodiments. The support substrate and the p-side electrode may be bonded not through the solder layer but through a different type bond layer.

The foregoing fourth to sixth embodiments show examples of a case where the sapphire substrate is used as the growth substrate. However, the present invention is not limited to these embodiments. Any substrate may be used as long as the crystal of the nitride semiconductor can be grown on the substrate. For example, a SiC substrate, a Si substrate, a GaAs substrate, a MgO substrate, a ZnO substrate, and a spinel substrate, or the like can be used.

Further, the foregoing first, second, fourth, and fifth embodiments show examples of a case where the InGaN active layer is used. However, the present invention is not limited to these embodiments. The active layer, which is made of material other than InGaN, may be used. For example, the active layer, which is made of GaN, AlGaN, or the like, may be used.

The foregoing third embodiment shows an example of a case where the GaAs substrate is used as the growth substrate. However, the present invention is not limited to this embodiment. Any substrate may be used as long as the crystal of the nitride semiconductor can be grown on the substrate. For example, a sapphire substrate, a SiC substrate, a Si substrate, a MgO substrate, a ZnO substrate, a spinel substrate, or the like can be used.

The foregoing sixth embodiment shows an example of a case where the strain compensation layer is formed between the InGaN n-type cladding layer and the active layer by crystal growth. However, the present invention is not limited to this embodiment. The strain compensation layer, which is made of the altered layer obtained by alternating the surface of the n-type cladding layer, may be formed on the surface of the n-type cladding layer being at the side of the active layer.

What is claimed is:

1. A semiconductor device, comprising:
a semiconductor substrate formed of at least Ga and nitrogen;
an active layer formed on the semiconductor substrate; and
a nitride semiconductor layer formed on a surface of the semiconductor substrate between the semiconductor substrate and the active layer;
wherein a composition ratio of Ga in the nitride semiconductor layer is higher than a composition ratio of Ga in the semiconductor substrate, and
wherein the semiconductor substrate is a single layer.

2. The semiconductor device according to claim 1, wherein the semiconductor substrate is InGaN.

3. The semiconductor device according to claim 1, wherein the active layer is InGaN.

4. The semiconductor device according to claim 1, wherein the nitride semiconductor layer is InGaN.

5. The semiconductor device according to claim 1, further comprising a cladding layer formed of the same constituent element as a constituent element of the semiconductor substrate.

6. The semiconductor device according to claim 1, wherein the nitride semiconductor layer is formed to contact with the surface of the semiconductor substrate.

7. The semiconductor device according to claim 1, wherein the nitride semiconductor layer is formed as an altered layer where the surface of the semiconductor substrate is altered.

* * * * *